United States Patent
Han et al.

(10) Patent No.: US 11,756,894 B2
(45) Date of Patent: Sep. 12, 2023

(54) RADIO-FREQUENCY (RF) INTEGRATED CIRCUIT (IC) (RFIC) PACKAGES EMPLOYING A SUBSTRATE SIDEWALL PARTIAL SHIELD FOR ELECTRO-MAGNETIC INTERFERENCE (EMI) SHIELDING, AND RELATED FABRICATION METHODS

(71) Applicant: QUALCOMM Incorporated, San Diego, CA (US)

(72) Inventors: Jeahyeong Han, San Diego, CA (US); Rajneesh Kumar, San Diego, CA (US); Jeongil Jay Kim, San Diego, CA (US); Chin-Kwan Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 165 days.

(21) Appl. No.: 16/879,517

(22) Filed: May 20, 2020

(65) Prior Publication Data

US 2021/0366838 A1    Nov. 25, 2021

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS

| 10,037,949 B1 | 7/2018 | Kim et al. | |
| 2006/0266547 A1* | 11/2006 | Koga | H05K 1/0218 |
| | | | 257/E23.125 |

(Continued)

FOREIGN PATENT DOCUMENTS

JP    2011228322 A    11/2011

OTHER PUBLICATIONS

International Search Report and Written Opinion for International Patent Application No. PCT/US2021/028115, dated Aug. 5, 2021, 17 pages.

*Primary Examiner* — Hung K Vu
(74) *Attorney, Agent, or Firm* — Withrow & Terranova, PLLC

(57) ABSTRACT

Radio-frequency (RF) integrated circuit (IC) (RFIC) packages employing a substrate sidewall partial shield for electro-magnetic interference (EMI) shielding. A RFIC package includes an IC die layer that includes a RFIC die(s) mounted on a substrate that includes substrate metallization layers, a substrate core, and substrate antenna layers. The RFIC package includes an EMI shield surrounding the IC die layer and extending down shared sidewalls of the IC die layer and the substrate. The EMI shield extends down the sidewalls of the IC die layer and substrate metallization layers of the substrate to at least the interface between the substrate metallization layers and the substrate core, and without extending adjacent to the sidewall of the substrate antenna layers. In this manner, antenna performance of the antenna module may not be degraded, because extending the EMI shield down sidewalls of the substrate antenna layers can create a resonance cavity in the substrate.

19 Claims, 22 Drawing Sheets

(51) Int. Cl.
  *H01L 23/498* (2006.01)
  *H01L 23/66* (2006.01)
  *H01L 23/00* (2006.01)
  *H01Q 1/22* (2006.01)
  *H01Q 1/52* (2006.01)

(52) U.S. Cl.
  CPC .. *H01L 23/49822* (2013.01); *H01L 23/49838* (2013.01); *H01L 23/66* (2013.01); *H01L 24/16* (2013.01); *H01Q 1/2283* (2013.01); *H01Q 1/526* (2013.01); *H01L 2223/6677* (2013.01); *H01L 2224/16227* (2013.01); *H01L 2924/3025* (2013.01)

(56) References Cited

U.S. PATENT DOCUMENTS

| | | | |
|---|---|---|---|
| 2012/0228749 A1* | 9/2012 | Pagaila | H01L 21/56 257/659 |
| 2017/0323838 A1 | 11/2017 | Otsubo et al. | |
| 2018/0159216 A1 | 6/2018 | Kai et al. | |
| 2018/0159217 A1 | 6/2018 | Mikata et al. | |
| 2019/0139915 A1 | 5/2019 | Dalmia et al. | |
| 2019/0237409 A1 | 8/2019 | Kitazaki et al. | |
| 2019/0372210 A1 | 12/2019 | Mikata | |
| 2020/0020653 A1* | 1/2020 | Lim | H01Q 1/243 |
| 2020/0335453 A1* | 10/2020 | Hong | H01L 23/13 |

\* cited by examiner

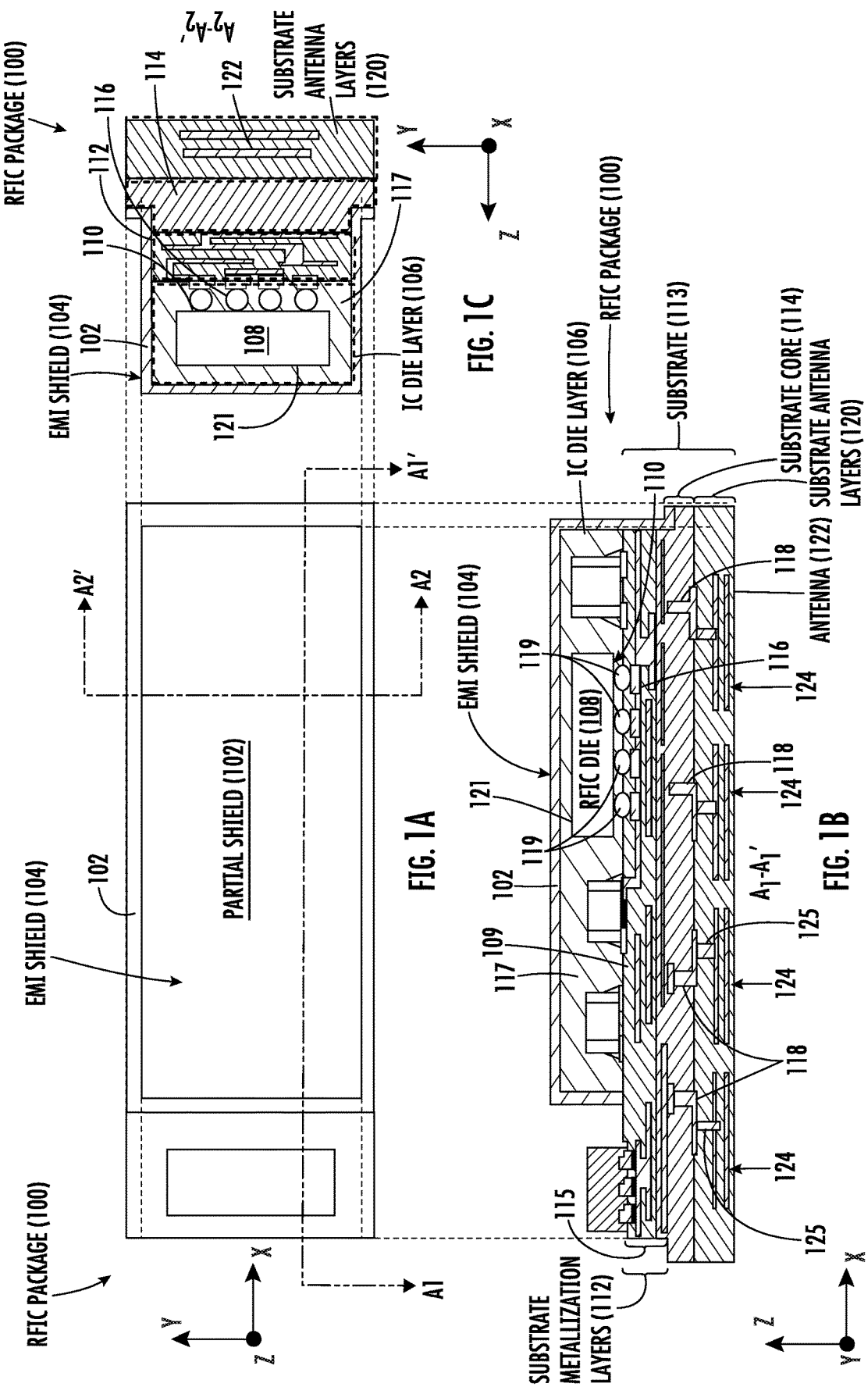

FROM FIG. 4A

410

FORMING AN IC DIE LAYER (106) COMPRISING A BOTTOM SURFACE (109) AND AN IC DIE LAYER SIDEWALL (126) DISPOSED IN THE SECOND PLANE ($P_2$), THE IC DIE LAYER (106) FURTHER COMPRISING A RADIO-FREQUENCY (RF) IC (RFIC) DIE (108) COMPRISING AN ACTIVE SURFACE (110) COMPRISING ONE OR MORE DIE INTERCONNECTS (119) AND AN INACTIVE SURFACE (121) OPPOSITE THE ACTIVE SURFACE (110),
THE BOTTOM SURFACE (109) OF THE IC DIE LAYER (106) MOUNTED ON THE SUBSTRATE METALLIZATION LAYERS (112), OF THE SUBSTRATE (113) AND AT LEAST ONE DIE INTERCONNECT (119) AMONG THE ONE OR MORE DIE INTERCONNECTS (119) ELECTRICALLY COUPLED TO AN INTERCONNECT LAYER (115) AMONG THE AT LEAST ONE INTERCONNECT LAYER (115) IN THE SUBSTRATEMETALLIZATION LAYERS (112)

412

FORMING AN ELECTRO-MAGNETIC INTERFERENCE (EMI) SHIELD (104) DISPOSED ABOVE THE IC DIE LAYER (106) WHEREIN A BOTTOM SURFACE (136) OF THE EMI SHIELD (104) IS DISPOSED ADJACENT TO THE SUBSTRATE CORE SIDEWALL (130(1))

FIG. 4B

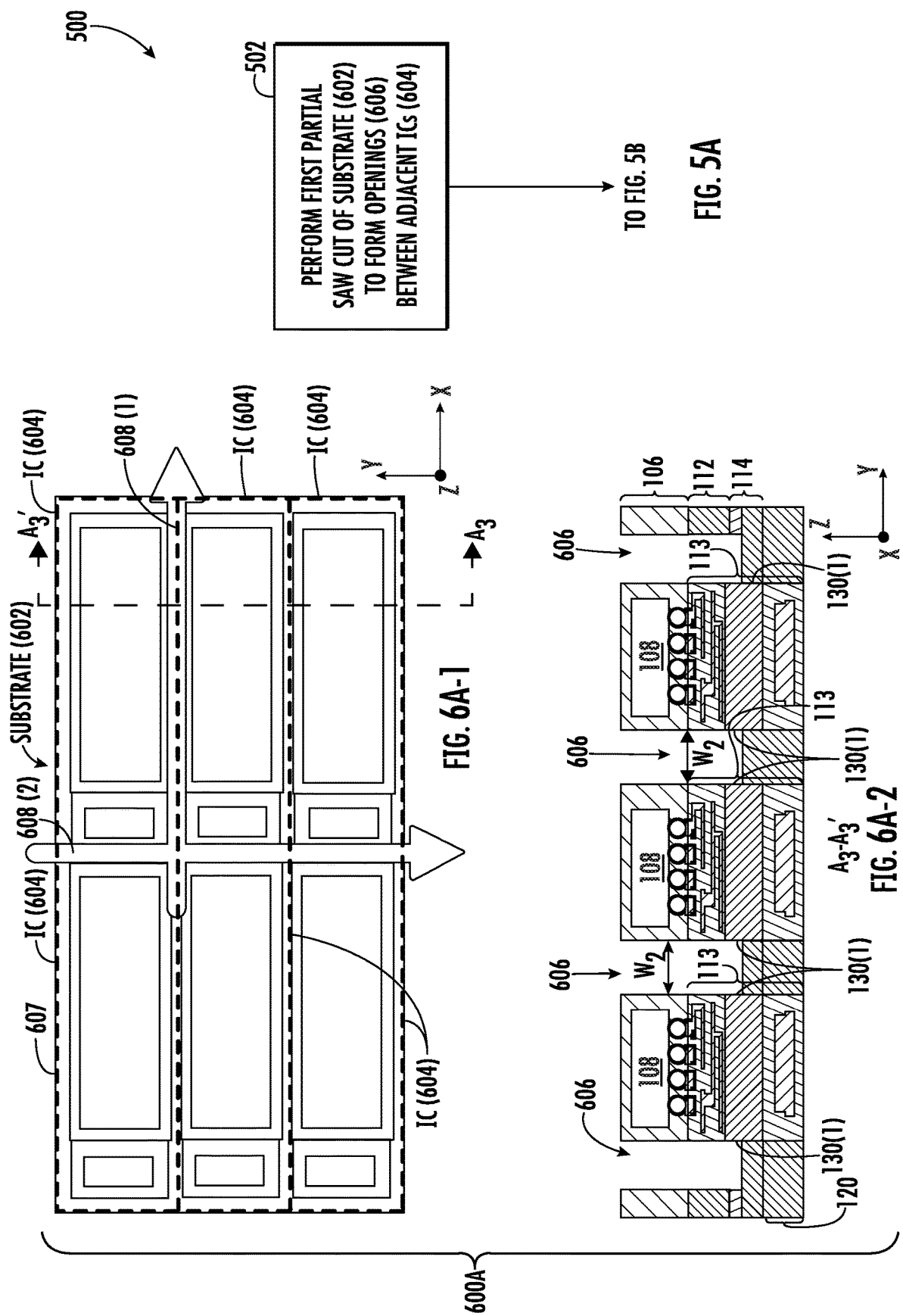

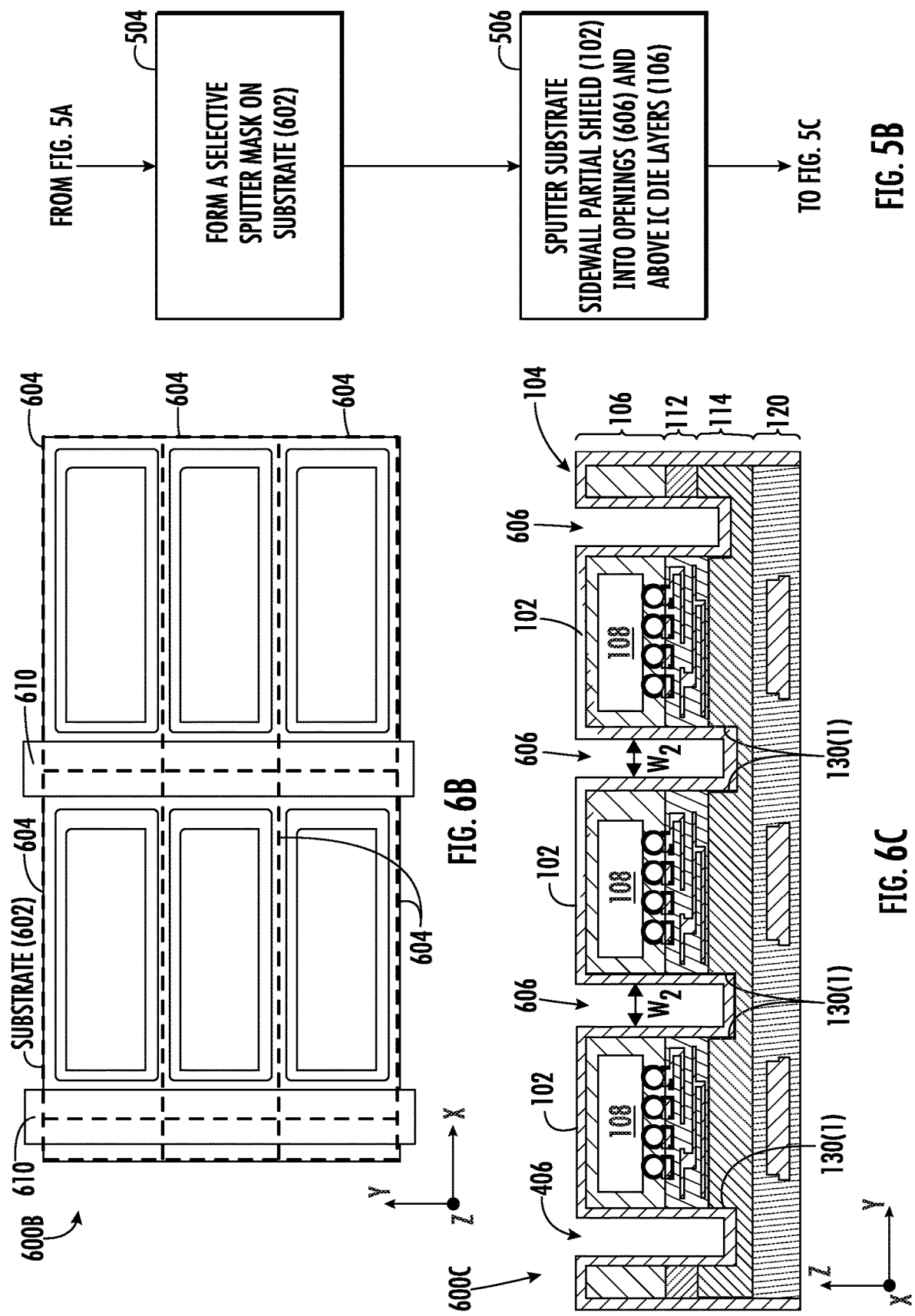

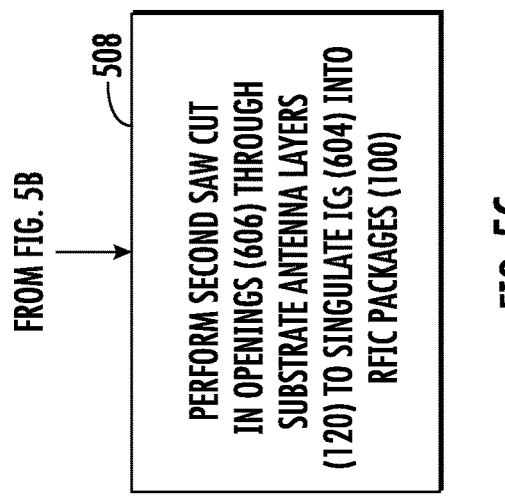
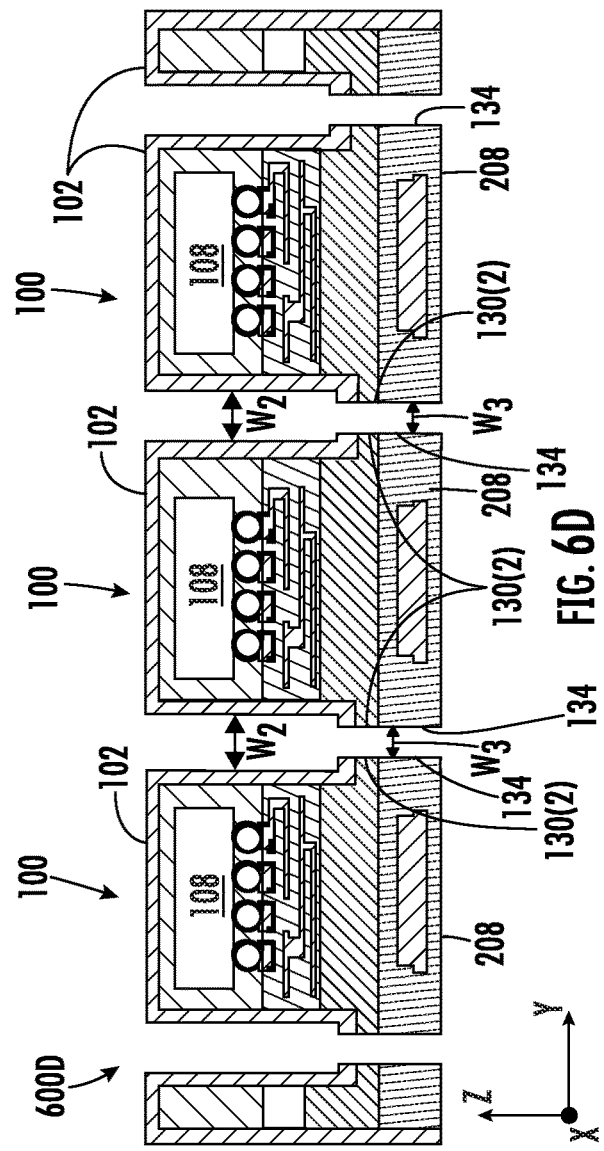

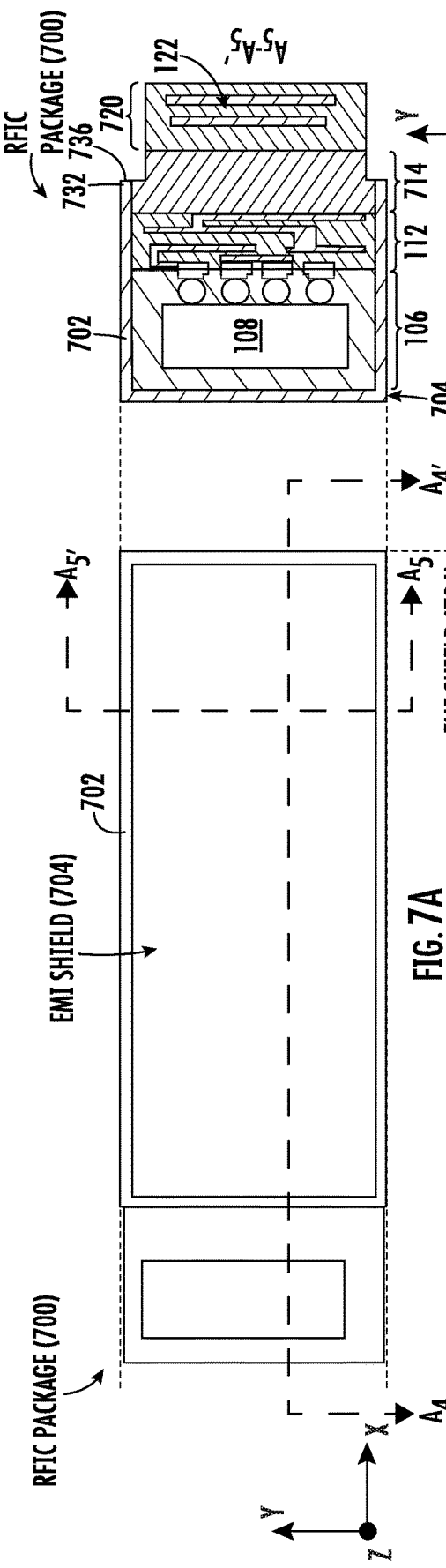
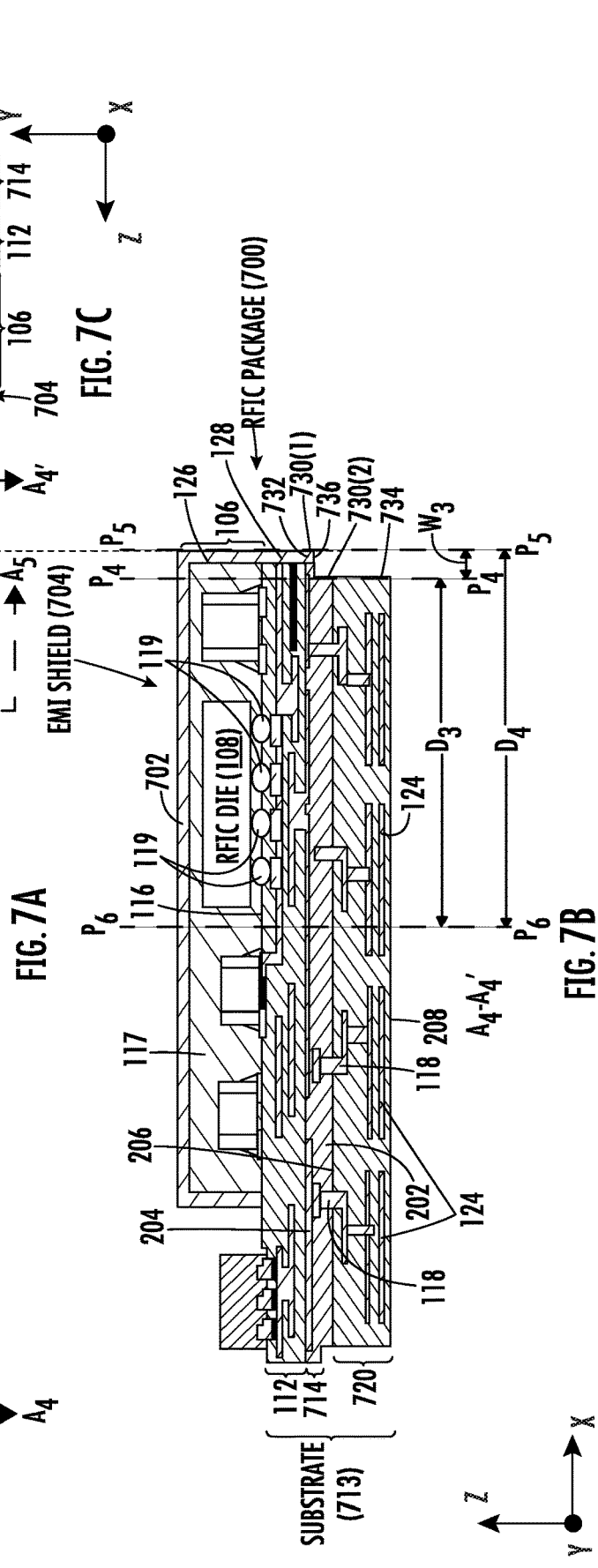
FIG. 7A
FIG. 7B
FIG. 7C

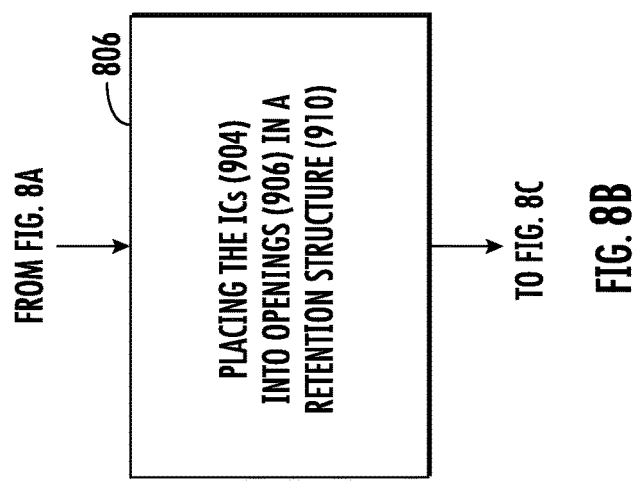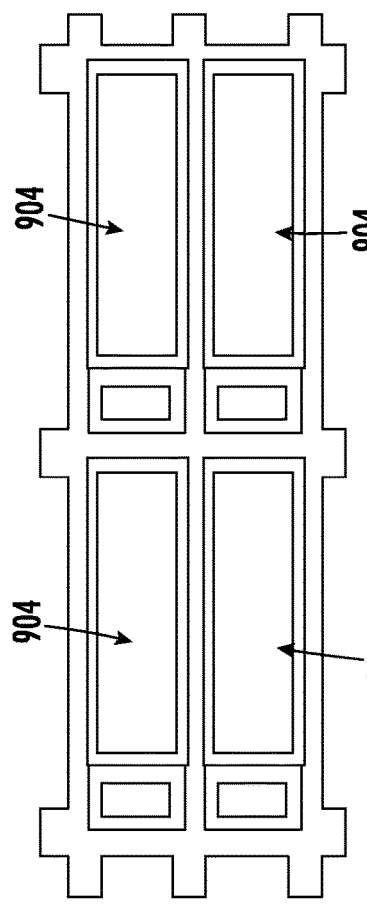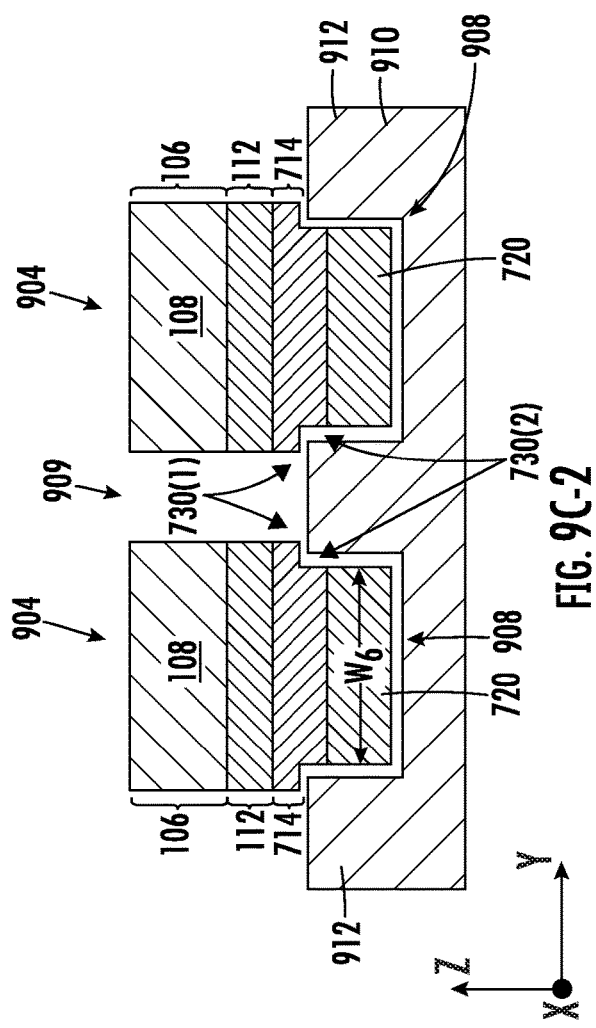

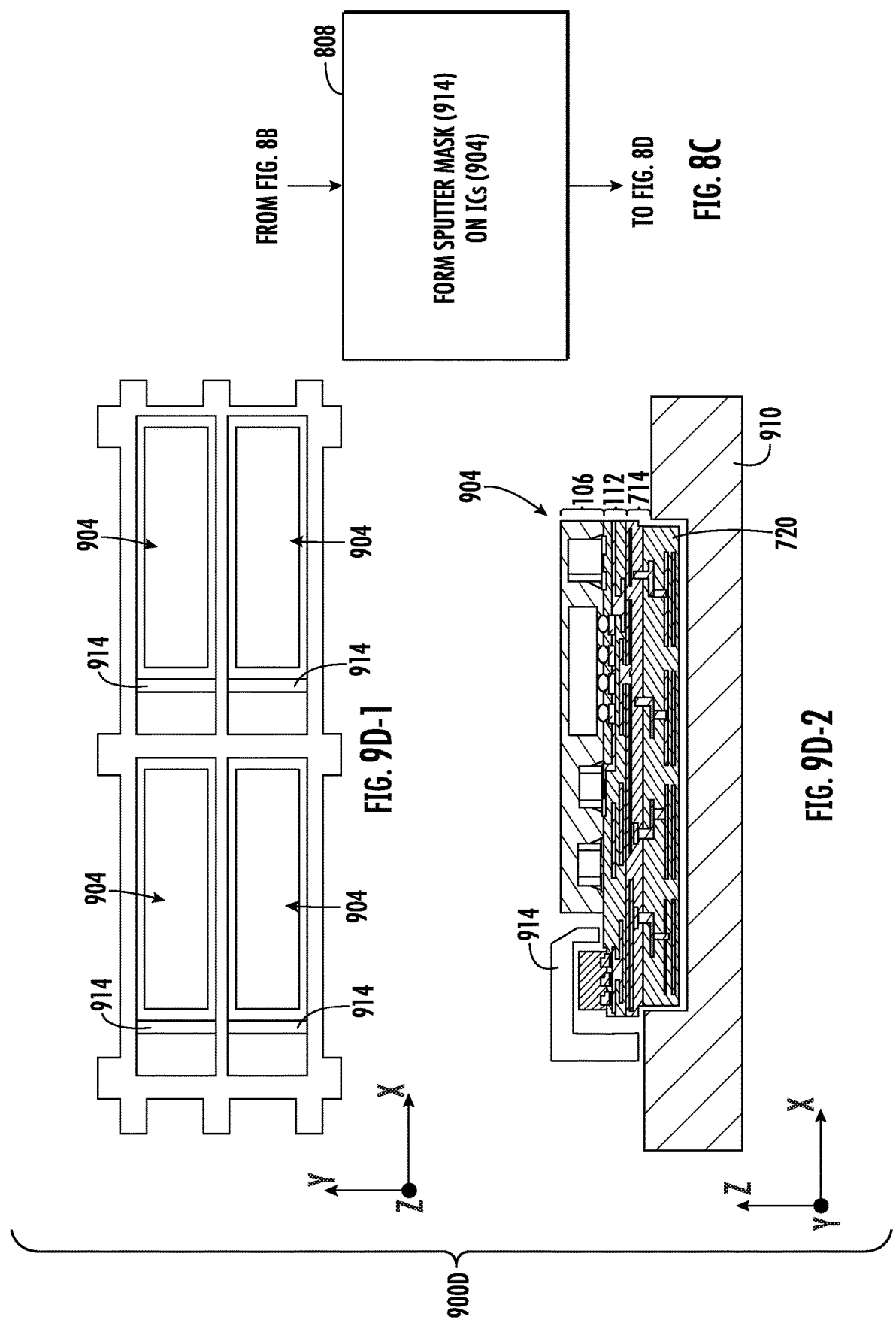

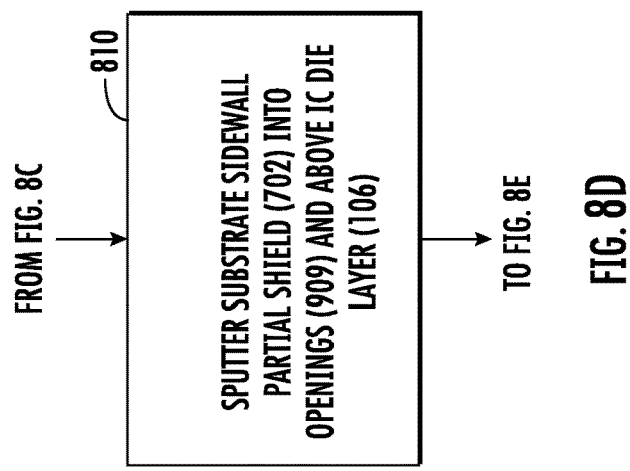
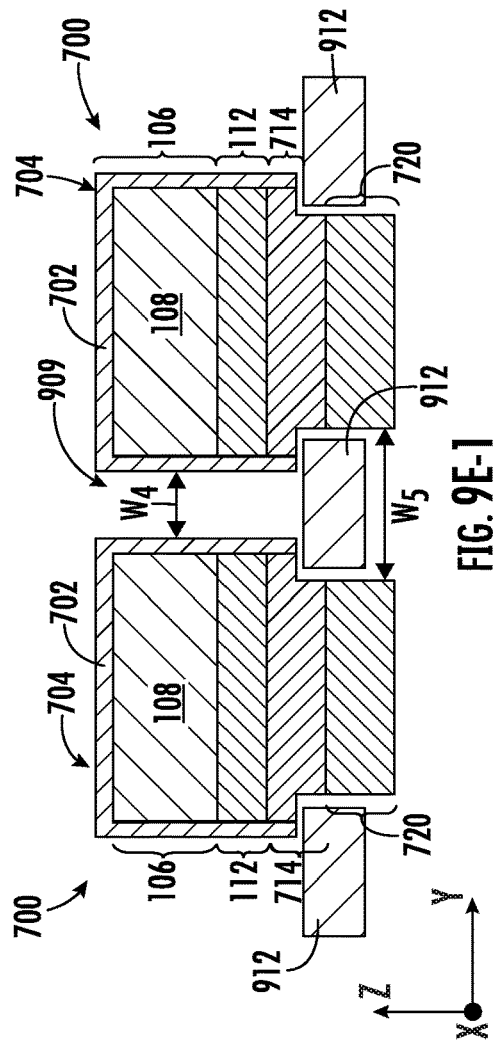
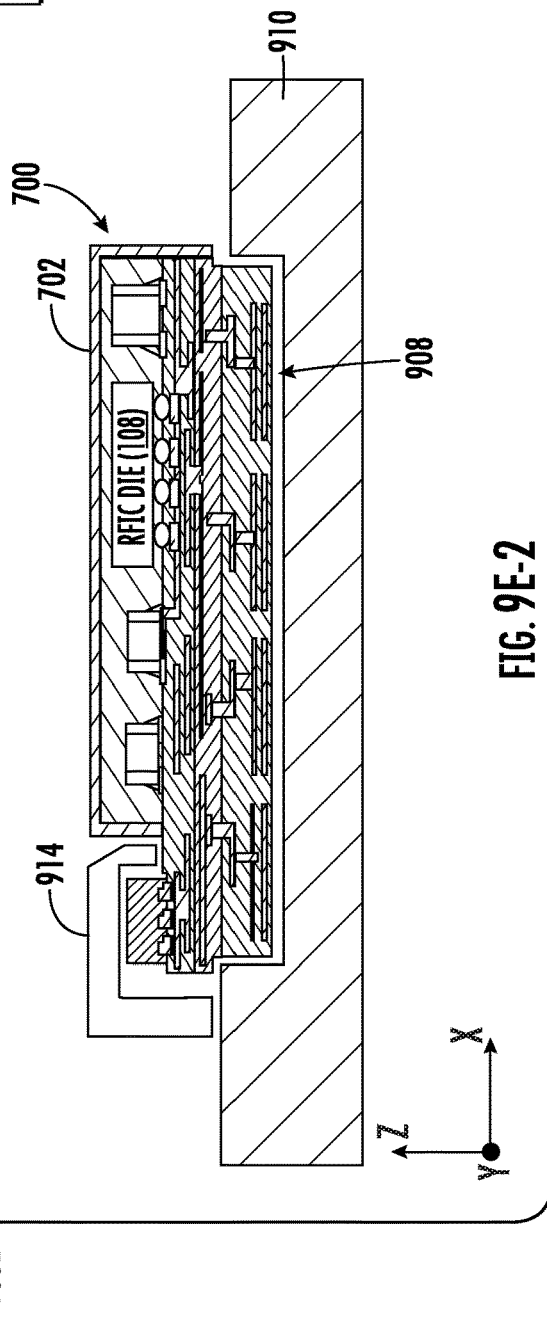

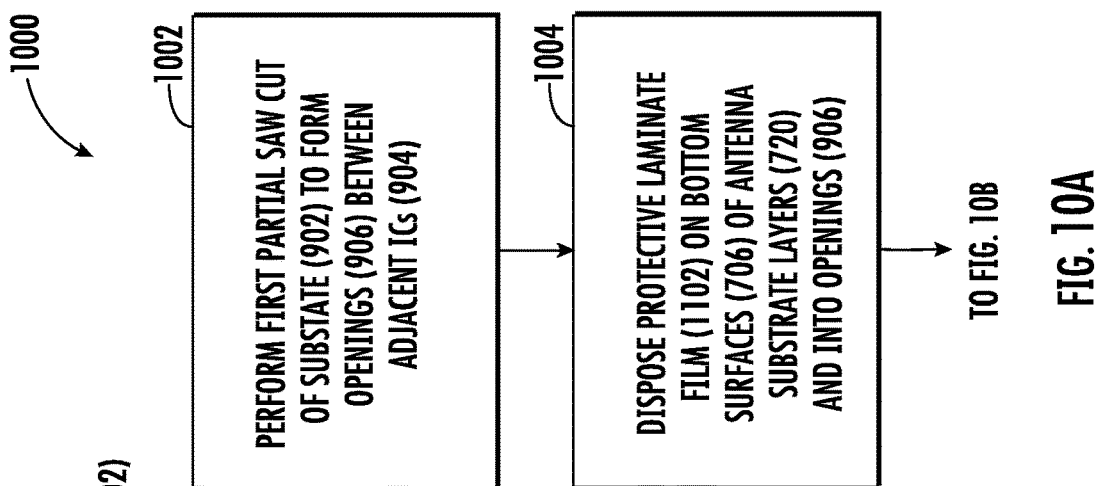
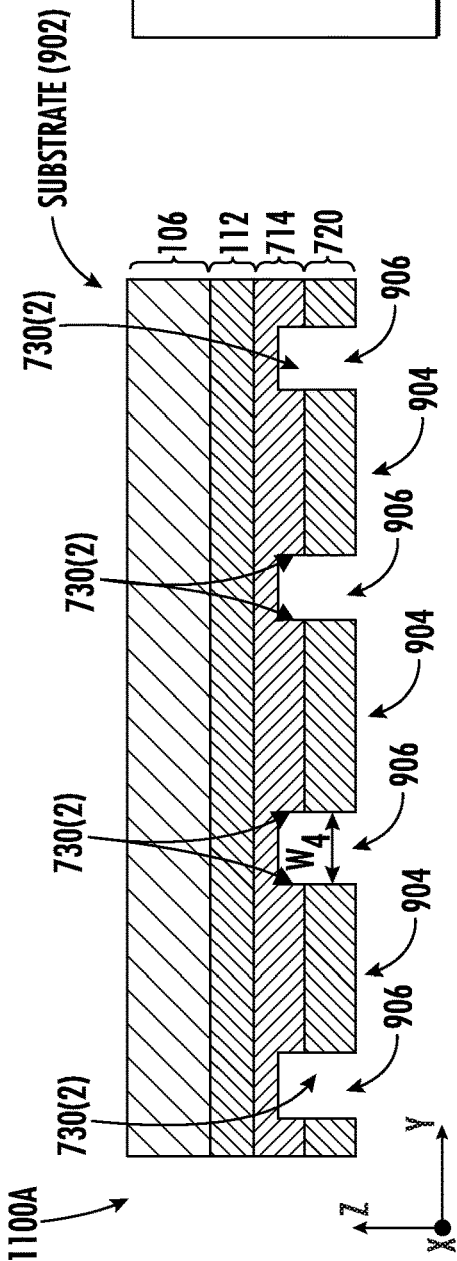
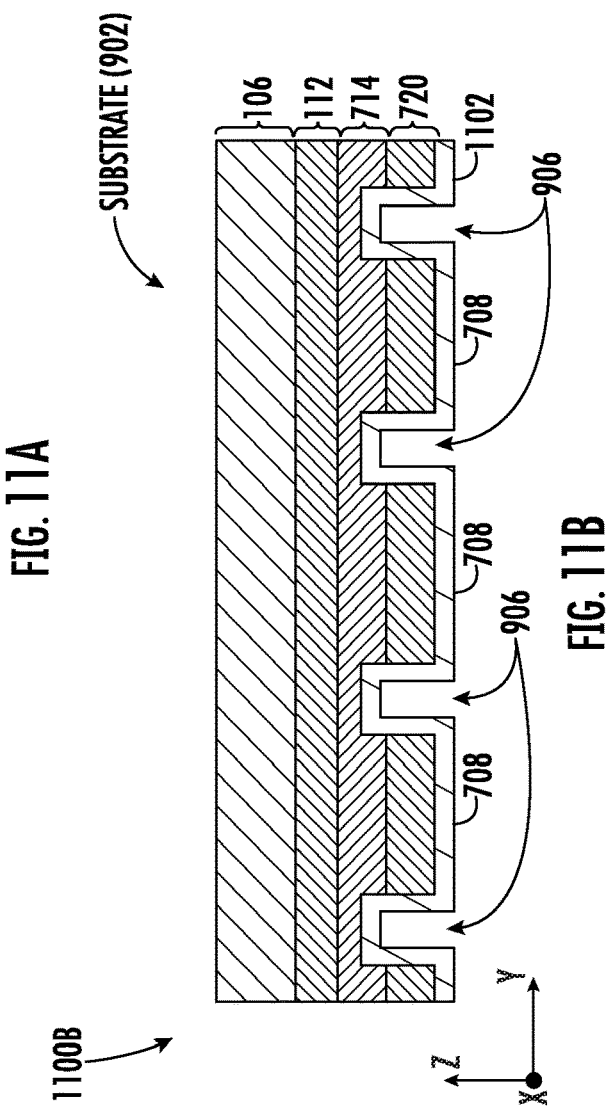

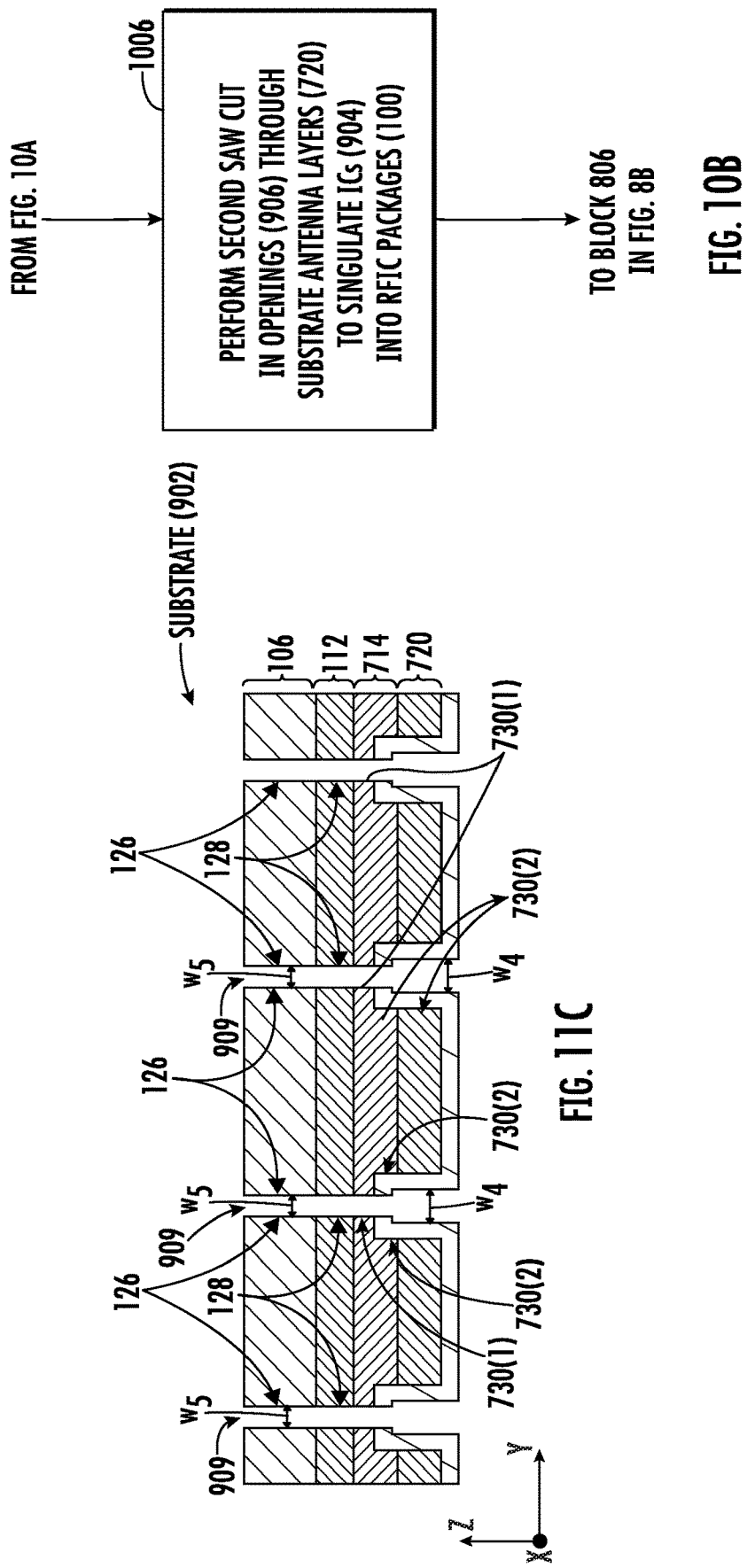

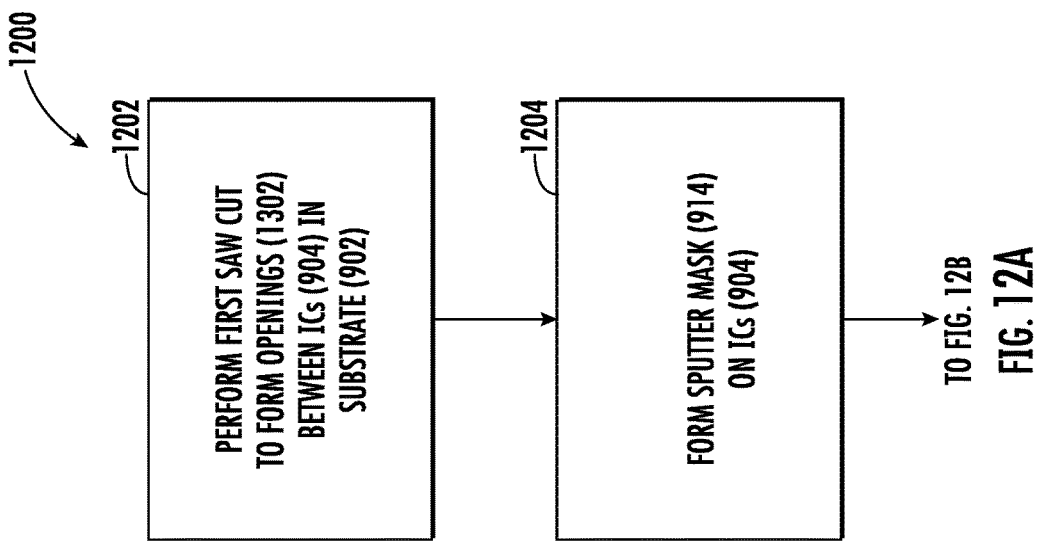
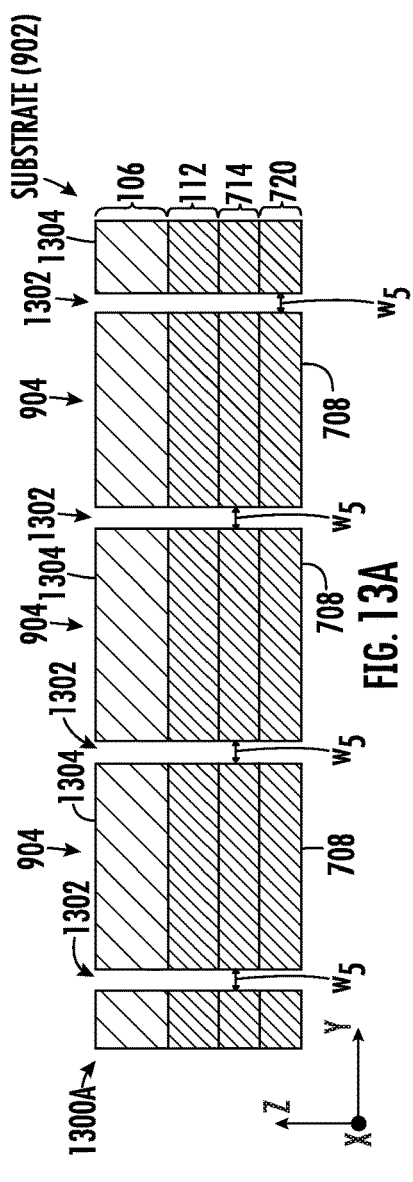
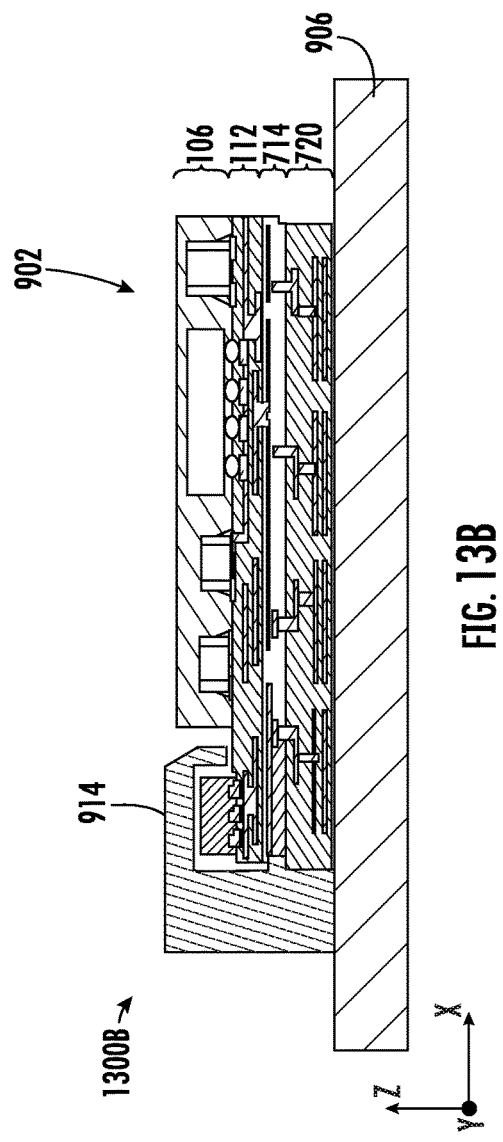

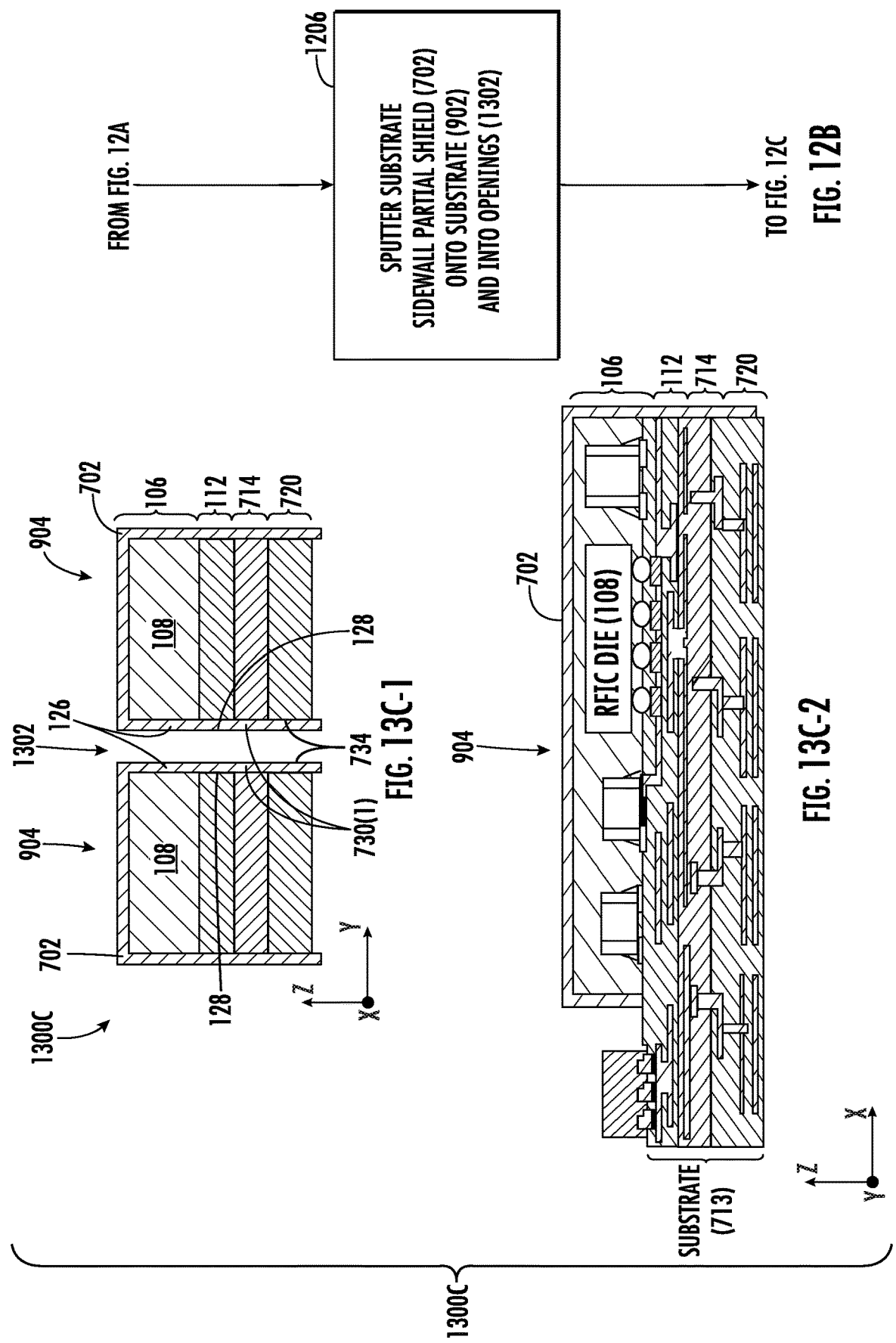

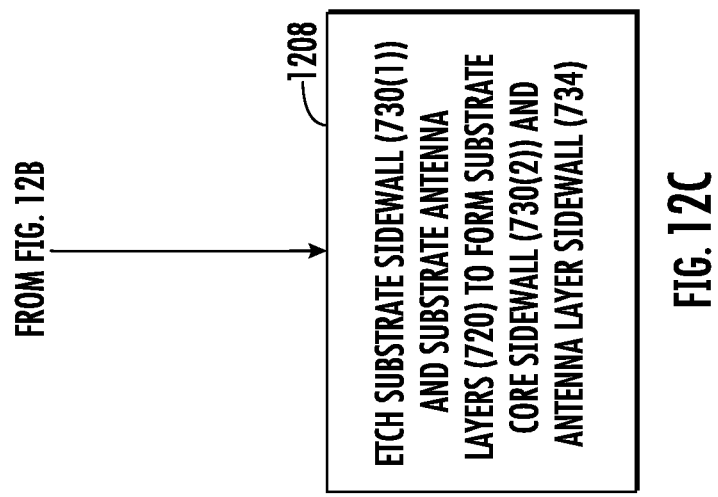
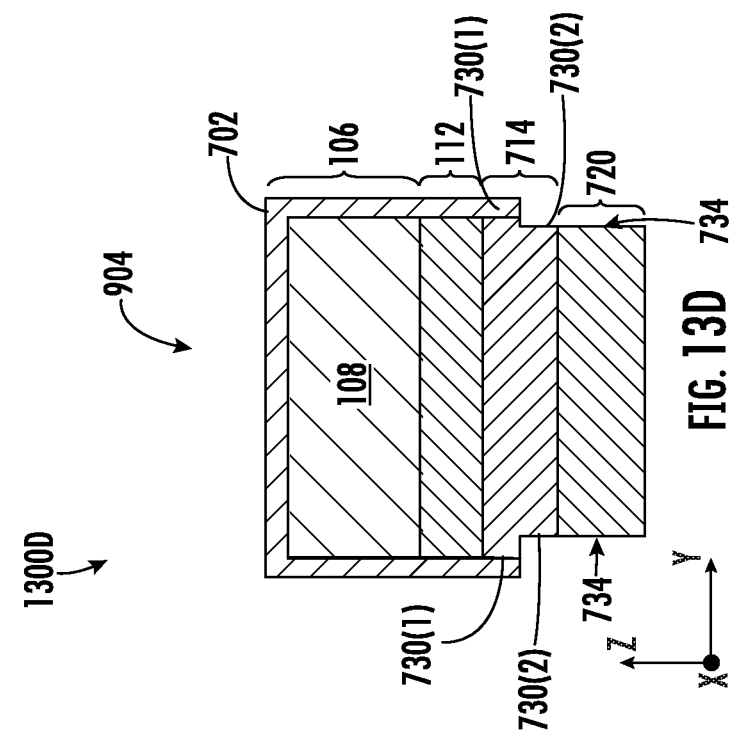

RADIO-FREQUENCY (RF) INTEGRATED CIRCUIT (IC) (RFIC) PACKAGES EMPLOYING A SUBSTRATE SIDEWALL PARTIAL SHIELD FOR ELECTRO-MAGNETIC INTERFERENCE (EMI) SHIELDING, AND RELATED FABRICATION METHODS

BACKGROUND

I. Field of the Disclosure

The field of the disclosure relates to radio-frequency (RF) integrated circuit (IC) (RFIC) packages that include a semiconductor die module and antenna module as part of a substrate structure, and electro-magnetic interference (EMI) shields incorporated into the RFIC package to shield EMI.

II. Background

Modern smart phones and other portable devices have extended the use of different wireless links with a variety of technologies in different radio frequency bands. For example, fifth generation (5G) cellular networks, commonly referred to as 5G NR include frequencies in the range of 24.25 to 86 Gigahertz (GHz), with the lower 19.25 GHz (24.25-43.5 GHz) more likely to be used for mobile devices. To support the integration of one or more radio-frequency (RF) transceivers in a device, the RF transceivers are integrated in RF integrated circuit (IC) (RFIC) transceiver chips in an RFIC package. A conventional RFIC package includes one or more RFIC transceiver chips, a power management IC (PMIC), and passive electrical components (e.g., inductors, capacitors, etc.). The IC chips are mounted to a substrate support structure as part of the RFIC package. The support structure may include one or more metallization structures to provide chip-to-chip and external signal interfaces to the IC chips. The RFIC package also includes an antenna module as part of a substrate and is electrically coupled through a metallization structure(s) to the RFIC transceiver chip to receive electrical signals that are radiated as electro-magnetic (EM) signals.

The RFIC package also includes EM interference (EMI) shielding since noise generated by the IC chips could cause de-sense or cross-talk issues within a mobile device.

SUMMARY OF THE DISCLOSURE

Aspects disclosed herein include radio-frequency (RF) integrated circuit (IC) (RFIC) packages employing a substrate sidewall partial shield for electro-magnetic interference (EMI) shielding. Related fabrication methods are also disclosed. In exemplary aspects, an RFIC package includes an IC die layer that includes an RFIC die(s) that includes RF transceiver ICs. The RFIC die is mounted on its respective active face to a substrate to provide an electrical interface to the RFIC die. The substrate includes substrate metallization layers that are electrically interfaced to the RFIC die. The RFIC die may be surrounded by a protective structure, such as a molding compound or dielectric material as part of the IC die layer. The substrate also includes a substrate core adjacent to the substrate metallization layers as part of the substrate. The substrate also includes substrate antenna layers adjacent to the substrate core, wherein the substrate antenna layers include one or more embedded antenna elements. The substrate core includes embedded conductive pillars that are electrically coupled to the antenna elements in the substrate antenna layers and to electrical traces in the substrate metallization layers to electrically couple the RFIC die to the antenna elements. Shared sidewalls between the IC die layer and the substrate that includes the substrate metallization layers, the substrate core, and the substrate antenna layers are formed in the RFIC package as a result of IC package singulation.

In exemplary aspects, to shield the RFIC die from EMI interference, the RFIC package also includes an EMI shield. The EMI shield surrounds the IC die layer and extends down the shared sidewalls of the IC die layer and the substrate. The EMI shield is formed so as to extend down the sidewalls of the IC die layer and substrate metallization layers of the substrate to at least the interface between the substrate metallization layers and the substrate core, and without extending on the sidewall of the substrate antenna layers. In this manner, antenna performance of the antenna elements in the substrate antenna layers may not be degraded and improved, because extending the EMI shield down the sidewall of the substrate antenna layers can create a resonance cavity in the substrate. Creating this resonance cavity can create extra antenna return paths for the antenna elements thus changing their radiation patterns and degrading their performance. Avoiding degradation in antenna performance of an RFIC package may be particularly important when the substrate antenna layers have to be reduced in size, such as for new generation 5G antennas that are designed to operate in millimeter (mm) wavelengths, as a non-limiting example.

In this regard, in one exemplary aspect, an IC package is disclosed. The IC package includes a substrate. The substrate includes substrate antenna layers disposed in a horizontal plane and including an antenna including one or more antenna elements, the substrate antenna layers including an antenna layer sidewall disposed in a first plane. The substrate also includes a substrate core including a substrate core sidewall disposed in a second plane parallel with the first plane. The substrate core is adjacent to the substrate antenna layers. The substrate core further includes one or more conductive pillars. The one or more antenna elements in the substrate antenna layers are electrically coupled to the one or more conductive pillars in the substrate core. The substrate also includes substrate metallization layers including a metallization layer sidewall disposed in the second plane. The substrate metallization layers are disposed adjacent to the substrate core and further include one or more interconnect layers. At least one interconnect layer among the one or more interconnect layers is electrically coupled to at least one conductive pillar among the one or more conducive pillars in the substrate core. The substrate also includes an IC die layer including a bottom surface and an IC die layer sidewall disposed in the second plane. The IC die layer further includes a RFIC die including an active surface including one or more die interconnects and an inactive surface opposite the active surface. The bottom surface of the IC die layer is mounted on the substrate metallization layers, and at least one die interconnect among the one or more die interconnects is electrically coupled to an interconnect layer among the at least one interconnect layer in the substrate metallization layers. The substrate also includes an EMI shield disposed above the IC die layer wherein a bottom surface of the EMI shield is disposed adjacent to the substrate core sidewall.

In another exemplary aspect, a method of fabricating an IC package is disclosed. The method includes forming a substrate including a plurality of ICs disposed adjacent to each other on a common substrate. For each IC of the plurality of ICs, the method includes forming substrate antenna layers disposed in a horizontal plane and including an antenna including one or more antenna elements. The substrate antenna layers include an antenna layer sidewall disposed in a first plane. The method also includes forming a substrate core including a substrate core sidewall disposed in a second plane parallel with the first plane. The substrate core is disposed on the substrate antenna layers. The substrate core further includes one or more conductive pillars. The one or more antenna elements in the substrate antenna layers are electrically coupled to the one or more conductive pillars in the substrate core. The method also includes forming substrate metallization layers including a metallization layer sidewall disposed in the second plane. The substrate metallization layers are disposed on the substrate core and further include one or more interconnect layers. At least one interconnect layer among the one or more interconnect layers is electrically coupled to at least one conductive pillar among the one or more conductive pillars in the substrate core. The method also includes forming an IC die layer including a bottom surface and an IC die layer sidewall disposed in the second plane. The IC die layer further includes a RFIC die including an active surface including one or more die interconnects and an inactive surface opposite the active surface. The bottom surface of the IC die layer is mounted on the substrate metallization layers of the substrate, and at least one die interconnect among the one or more die interconnects is electrically coupled to an interconnect layer among the at least one interconnect layer in the substrate metallization layers. The method also includes forming an EMI shield disposed above the IC die layer. A bottom surface of the EMI shield is disposed adjacent to the substrate core sidewall.

BRIEF DESCRIPTION OF THE FIGURES

FIGS. 1A-1C are respective top, front, and side views of an exemplary radio-frequency (RF) integrated circuit (IC) (RFIC) package employing a substrate sidewall partial shield for electro-magnetic interference (EMI) shielding;

FIGS. 4A and 4B are a flowchart illustrating an exemplary process of fabricating the RFIC package in FIGS. 1A-2B that employs a substrate sidewall partial shield for EMI shielding;

FIGS. 5A-5C are a flowchart illustrating an exemplary double saw process for fabricating the RFIC package in FIGS. 1A-2B that employs a substrate sidewall partial shield for EMI shielding:

FIGS. 6A-1-6D illustrate exemplary fabrication stages during fabrication of the RFIC package in FIGS. 1A-2B according to the exemplary process in FIGS. 5A-5C;

FIGS. 7A-7C are respective top, front, and side views of another exemplary RFIC package employing a substrate sidewall partial shield for EMI shielding;

FIGS. 8A-8E are a flowchart illustrating a first exemplary process for fabricating the RFIC package in FIGS. 7A-7C that employs a substrate sidewall partial shield for EMI shielding FIGS. 9A-9F-2 illustrate exemplary fabrication stages during fabrication of the RFIC package in FIGS. 7A-7C according to the exemplary process in FIGS. 8A-8E;

FIGS. 10A-10B are a flowchart illustrating a second exemplary process for fabricating the RFIC package in FIGS. 7A-7C that employs a substrate sidewall partial shield for EMI shielding FIGS. 11A-11C illustrate exemplary fabrication stages during fabrication of the RFIC package in FIGS. 7A-7C according to the exemplary process in FIGS. 10A-10B;

FIGS. 12A-12C are a flowchart illustrating a third exemplary process for fabricating the RFIC package in FIGS. 7A-7C that employs a substrate sidewall partial shield for EMI shielding;

FIGS. 13A-13D illustrate exemplary fabrication stages during fabrication of the RFIC package in FIGS. 7A-7C according to the exemplary process in FIGS. 12A-12C;

DETAILED DESCRIPTION

Figure 2A:
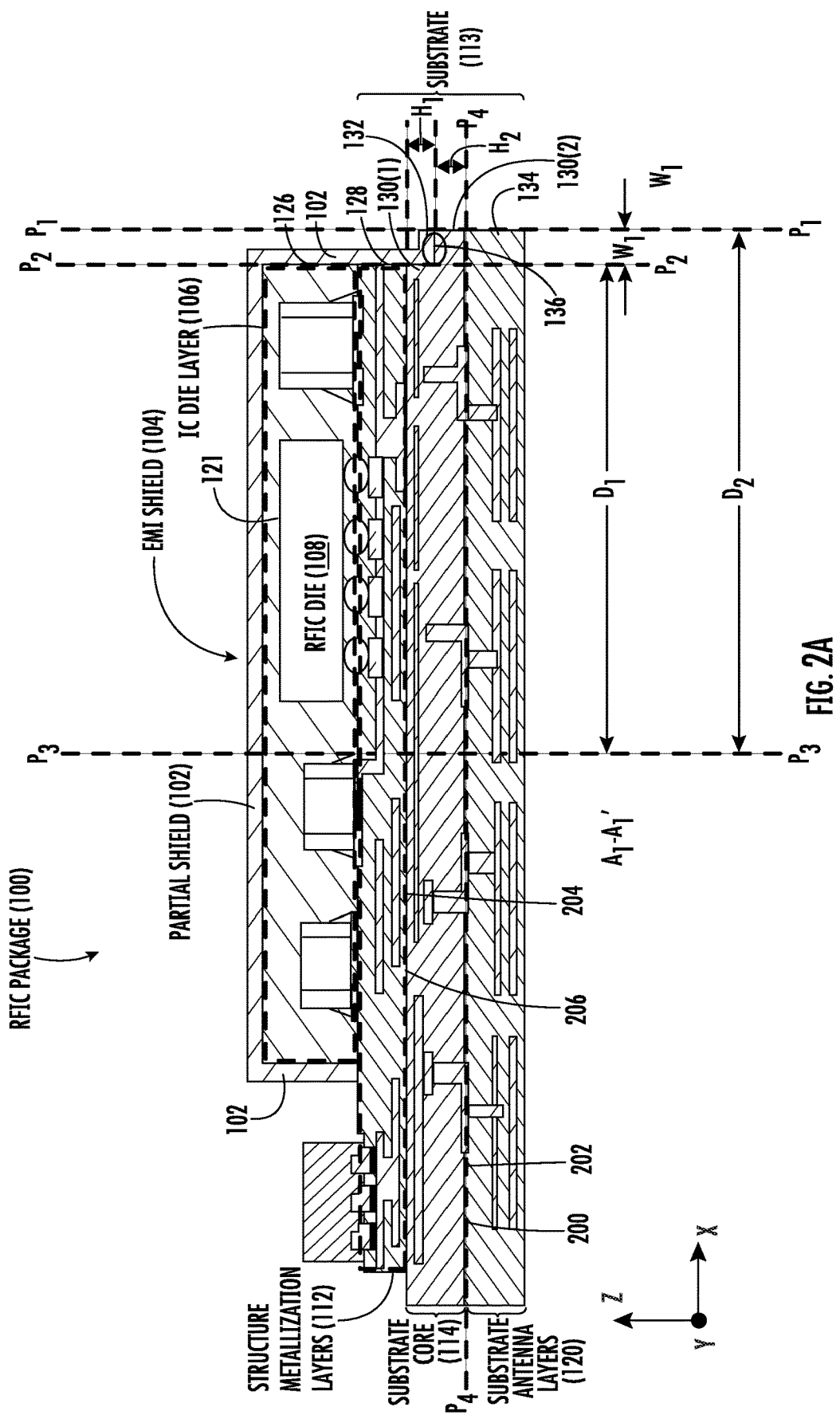
FIG. 2A is a more detailed side view of the RFIC package in FIGS. 1A-1C.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include radio-frequency (RF) integrated circuit (IC) (RFIC) packages employing a substrate sidewall partial shield for electro-magnetic interference (EMI) shielding. Related fabrication methods are also disclosed. In exemplary aspects, an RFIC package includes an IC die layer that includes radio-frequency IC die(s) (RFIC) die that includes RF transceiver ICs. The RFIC die is mounted on its respective active face to a substrate to provide an electrical interface to the RFIC die. The substrate includes substrate metallization layers that are electrically interfaced to the RFIC die. The RFIC die is surrounded by a protective structure, such as a molding compound or dielectric material as part of the IC die layer. The substrate also includes a substrate core adjacent to the substrate metallization layers as part of the substrate. The substrate also includes substrate antenna layers adjacent to the substrate core, wherein the substrate antenna layers include one or more embedded antenna elements. The substrate core includes embedded conductive pillars that are electrically coupled to the antenna elements in the substrate antenna layers and to electrical traces in the substrate metallization layers to electrically couple the RFIC die to the antenna elements. Shared sidewalls between the IC die layer and the substrate that includes the substrate metallization layers, the substrate core, and the substrate antenna layers are formed in the RFIC package as a result of IC package singulation.

In exemplary aspects, to shield the RFIC die from EMI interference, the RFIC package also includes an EMI shield. The EMI shield surrounds the IC die layer and extends down the shared sidewalls of the IC die layer and the substrate. The EMI shield is formed so as to extend down the sidewalls of the IC die layer and substrate metallization layers of the substrate to at least the interface between the substrate metallization layers and the substrate core, and without extending on the sidewall of the substrate antenna layers. In this manner, antenna performance of the antenna elements in the substrate antenna layers may not be degraded and improved, because extending the EMI shield down the sidewall of the substrate antenna layers can create a resonance cavity in the substrate. Creating this resonance cavity can create extra antenna return paths for the antenna elements thus changing their radiation patterns and degrading their performance. Avoiding degradation in antenna performance of an RFIC package may be particularly important when the substrate antenna layers have to be reduced in size, such as for new generation 5G antennas that are designed to operate in millimeter (mm) wavelengths, as a non-limiting example.

In this regard, FIGS. 1A-1C are respective top, front, and side views of an exemplary RFIC package 100 employing a substrate sidewall partial shield 102 as an electro-magnetic interference (EMI) shield 104. FIG. 1B is a front view of the RFIC package 100 along the $A_1$-$A_1'$ line in FIG. 1A. FIG. 1C is a side view of the RFIC package 100 along the $A_2$-$A_2'$ line in FIG. 1A. As shown in FIGS. 1B and 1C, the RFIC package 100 includes and packages an IC die layer 106 disposed in a horizontal X-Y horizontal plane and that includes an RFIC die 108 that includes encapsulated RF transceiver ICs. The substrate sidewall partial shield 102 provides EMI shielding of the RFIC die 108. The RFIC die 108 could include any ICs, such as RF transceiver ICs and/or power management ICs (PMICs). The RFIC die 108 could also be or include a PMIC. The substrate sidewall partial shield 102 may have been sputtered on to the IC die layer 106 as an example. A bottom surface 109 of the IC die layer 106 is mounted to substrate metallization layers 112 as part of a substrate 113 also disposed in a horizontal plane in an X-Y axis plane to provide an electrical interface between the RFIC die 108 and the substrate 113. The substrate 113 is a material that supports the formation of the substrate metallization layers 112 and other layers as discussed in more detail below. In this regard, an active surface 110 of the RFIC die 108 is electrically coupled the substrate metallization layers 112 also disposed in a horizontal plane in an X-Y axis plane to provide an electrical interface between the RFIC die 108 and a substrate core 114.

With continuing reference to FIGS. 1A-1C, a protective structure 117, such as a molding compound, is disposed on and above an inactive surface 121 of the RFIC die 108 as shown in FIGS. 1B and 1C. The substrate core 114 is disposed in a horizontal plan in an X-Y axis plane. As discussed in more detail below, the substrate 113 may be a package substrate or redistributed layers (RDLs) as examples. The substrate metallization layers 112 can include one or more interconnect layers 115 of electrical traces for signal routing and vertical interconnect accesses (vias) to couple electrical traces together between different interconnect layers 115. Die interconnects 119 on the active, bottom surface 110 of the RFIC die 108 are mounted to and coupled to solder balls 116 of the substrate metallization layers 112 to electrically couple the RFIC die 108 through the interconnect layers 115 in the substrate metallization layers 112 to the substrate core 114. The substrate core 114 includes conductive pillars 118 in this example, such as through-silica-vias (TSVs), that are electrically connected to the interconnect layers 115 in the substrate metallization layers 112 when the substrate metallization layers 112 are formed in the substrate 113 to provide an electrical interface through the substrate core 114 to the RFIC die 108.

With continuing reference to FIGS. 1B and 1C, the RFIC package 100 also includes substrate antenna layers 120 disposed in an X-Y horizontal plane. The substrate antenna layers 120 include an antenna 122 that includes one or more embedded antenna elements 124 to provide antennas for the RF transceiver ICs in the RFIC die 108. For example, the antenna elements 124 may be designed for wavelengths in fifth generation (5G) frequency bands. Multiple antenna elements 124 may be employed to provide signal transmission and reception capability, such as beamforming. The substrate antenna layers 120 also include conductive pillars 125 in this example that are electrically coupled to the conductive pillars 118 in the substrate core 114 when the substrate antenna layers 120 are formed in the substrate 113 adjacent to the substrate core 114 to provide an electrical interface to the antenna elements 124. Thus, the substrate core 114 and the substrate metallization layers 112 of the substrate 113 of the RFIC package 100 provide an electrical interface between the RFIC die 108 and the antenna elements 124 in the substrate antenna layers 120 to couple the antenna elements 124 to RF transceiver ICs in the RFIC die 108.

FIG. 2A is a more detailed illustration of the RFIC package 100 in FIGS. 1A-1C to illustrate more exemplary detail of the substrate sidewall partial shield 102 that forms the EMI shield 104. As shown in FIG. 2A, in this example, the substrate sidewall partial shield 102 forming the EMI shield 104 of the RFIC package 100 is formed so as to extend down and adjacent an IC die layer sidewall 126 of the IC die layer 106 and a metallization layer sidewall 128 of the substrate metallization layers 112 that are both disposed in a plane $P_2$ in a Y-Z axis plane. The substrate sidewall partial shield 102 also extends down and adjacent a first substrate core sidewall 130(1) of the substrate core 114 disposed in the plane $P_2$. However, the substrate core 114 also includes a second substrate core sidewall 130(2) disposed in a plane $P_1$ in a Y-Z axis plane parallel to the plane $P_2$ and extends out from plane $P_2$ to create a shoulder area 132 in the substrate core 114. The width $W_1$ of the shoulder area 132 is determined by the distance between the first and second substrate core sidewalls 130(1), 130(2) as shown in FIG. 2A.

An antenna layer sidewall 134 of the substrate antenna layers 120 is disposed in the same plane $P_1$ as the second substrate core sidewall 130(2) in this example. In this manner, the shoulder area 132 formed by the first and second substrate core sidewalls 130(1), 130(2) disposed in the different planes $P_1$, $P_2$ provides the shoulder area 132 such that substrate sidewall partial shield 102 only extends down and adjacent to the IC die layer sidewall 126, the metallization layer sidewall 128 and the first substrate core sidewall 130(1), but does not extend down and adjacent to the second substrate core sidewall 130(2). A bottom surface 136 of the substrate sidewall partial shield 102 only extends down to the shoulder area 132 of the substrate core 114 adjacent to the first substrate core sidewall 130(1). In this example, the second substrate core sidewall 130(2) and shoulder area 132 prevent the substrate sidewall partial shield 102 from extending down and adjacent to the antenna layer sidewall 134 such that the substrate sidewall partial shield 102 does not extend down and adjacent to the antenna layer sidewall 134.

In this manner, antenna performance of the antenna 122 in the substrate antenna layers 120 of the substrate 113 in FIG. 2A may not be degraded and actually may be improved. This is because extending the substrate sidewall partial shield 102 down the antenna layer sidewall 134 of the substrate antenna layers 120 can create a resonance cavity in the substrate 113.

Figure 2B:
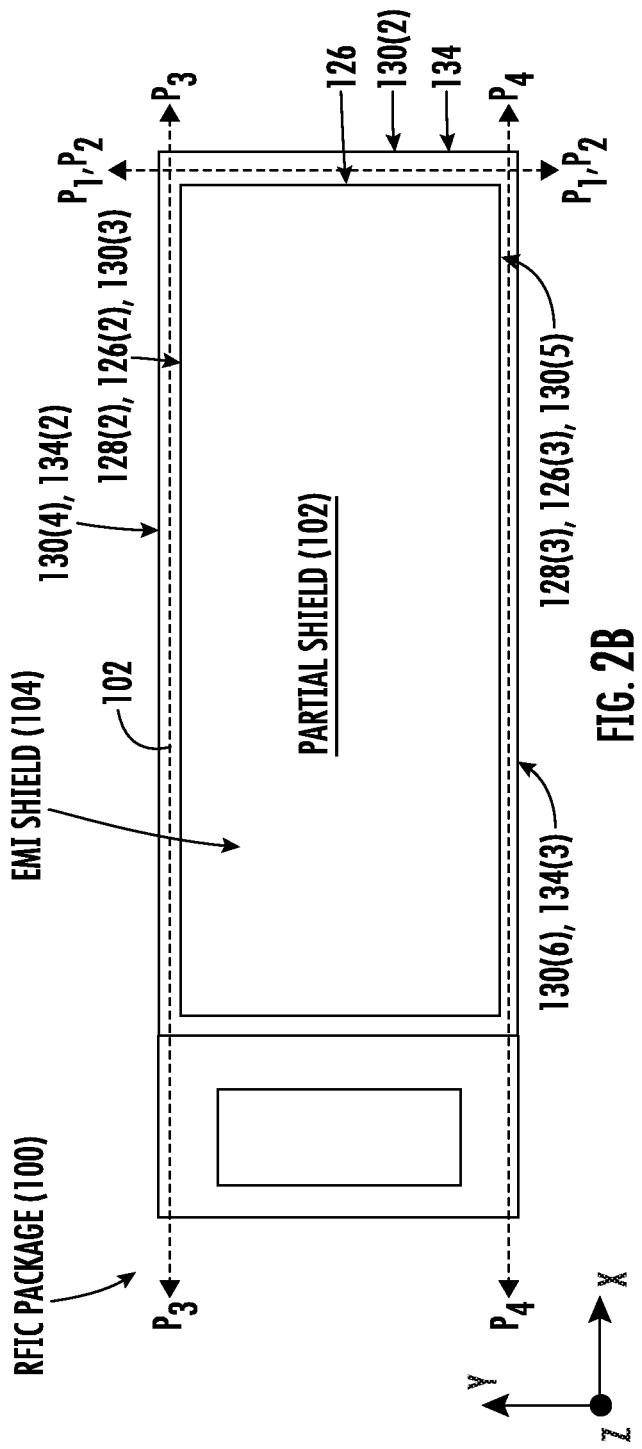
FIG. 2B is another top view of the RFIC package in FIGS. 1A-1C.

Note that as shown in the top view of the RFIC package 100 in FIG. 2B, the substrate sidewall partial shield 102 forming the EMI shield 104 of the RFIC package 100 can also extend down other respective sidewalls of the substrate 113 that are perpendicular to the IC die layer sidewall 126, metallization layer sidewall 128, first and second substrate core sidewalls 130(1), 130(2), and antenna layer sidewall 134. The substrate antenna layers 120 also includes a second antenna layer sidewall 134(2) disposed in a third plane $P_3$ perpendicular to the first plane $P_1$ and the second plane $P_2$ shown in FIG. 2A, and a third antenna layer sidewall 134(3) disposed in a fourth plane $P_4$ parallel to the third plane $P_3$. The substrate core 114 also includes a third substrate core sidewall 130(3) and a fourth substrate core sidewall 130(5) both adjacent to the substrate metallization layers 112 and that are disposed in the same peripheral planes as the substrate core sidewall 130(1). The substrate core 114 also includes a substrate core sidewall 130(4) disposed in the third plane $P_3$ and a substrate core sidewall 130(6) disposed in the fourth plane $P_4$, both adjacent to the substrate antenna layers 120, and disposed in the same peripheral planes as the substrate core sidewall 130(2). The substrate metallization layers 112 also include a second metallization layer sidewall 128(2) disposed in the third plane $P_3$, and a third metallization layer sidewall 128(3) disposed in the fourth plane $P_4$. The IC die layer 106 also includes a second IC die layer sidewall 126(2) disposed in the third plane $P_3$, and a third IC die layer sidewall 126(3) disposed in the fourth plane $P_4$. The EMI shield 104 is disposed above the IC die layer 106 and also adjacent to the second and third IC die layer sidewalls 126(2), 126(3), the second and third metallization layer sidewalls 128(2), 128(3), and the substrate core sidewalls 130(4), 130(6). In this manner, the substrate sidewall partial shield 102 also extends down the IC die layer sidewalls 126(2), 126(3), the metallization layer sidewalls 128(2), 128(3), and the substrate core sidewalls 130(3), 130(5), but not down and adjacent to the substrate core sidewalls 130(4), 130(6) and antenna layer sidewalls 134(2), 134(3).

Figure 3:
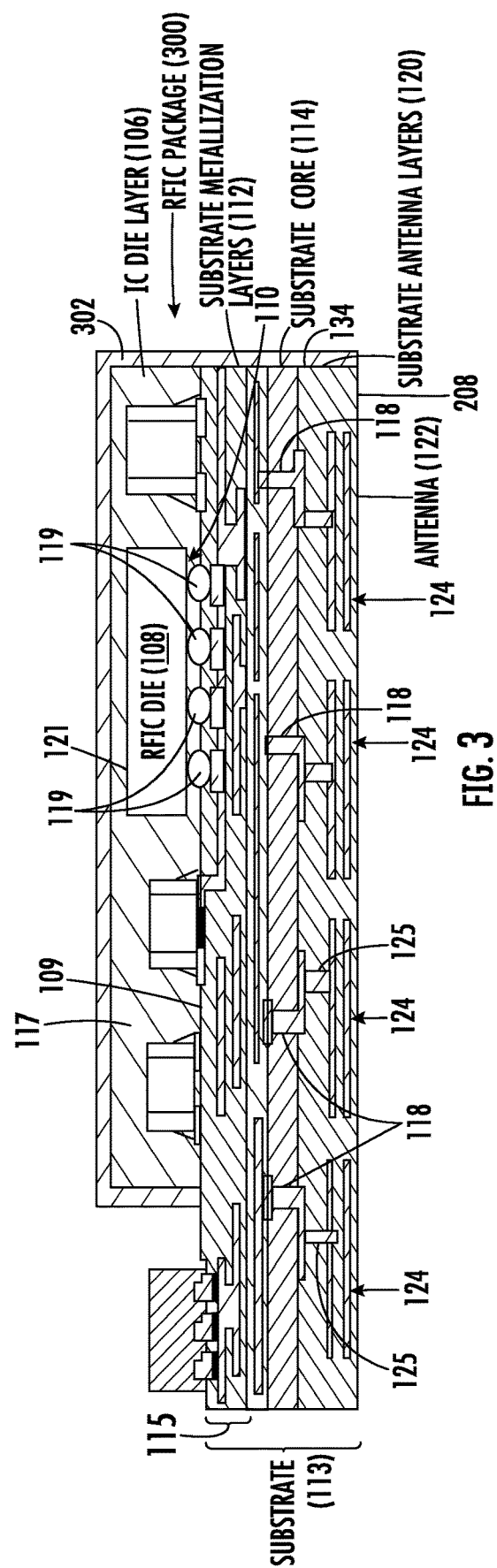
FIG. 3 is a view of an exemplary RFIC package employing a sidewall full shield for EMI shielding.

FIG. 3 illustrates an alternative RFIC package 300 that is similar to the RFIC package 100 in FIGS. 1A-2B. Common elements between the RFIC package 300 in FIG. 3 and the RFIC package 100 in FIGS. 1A-2B are shown with common element numbers. However, as shown in FIG. 3, an EMI shield 302 is provided that extends all the way down and adjacent to the antenna layer sidewall 134 to a bottom surface 208 of the substrate antenna layers 120. Extending the EMI shield 302 down to and adjacent to the antenna layer sidewall 134 in the RFIC package 300 in FIG. 3 can create a resonance cavity in the substrate antenna layers 120 of the substrate 113 that can create extra antenna return paths for the antenna elements 124 in the substrate antenna layers 120. This can change the antenna element 124 radiation patterns and degrade the performance of the RF transceiver ICs in the RFIC die 108 of the RFIC package 300. With reference back to FIG. 2A, not extending the substrate sidewall partial shield 102 adjacent to the antenna layer sidewall 134 of the substrate antenna layers 120 of the substrate 113 of the RFIC package 100 can avoid degrading antenna 122 performance of the RFIC package 100, which may be particularly important when the substrate antenna layers 120 have to be reduced in size, such as for 5G antennas. 5G antennas are designed to operate in millimeter (mm) wavelengths.

With reference back to the RFIC package 100 in FIG. 2A, the shoulder area 132 is formed by the two substrate core sidewalls 130(1), 130(2) being located different respective distances $D_1$, $D_2$ from a center plane $P_3$ of the RFIC package 100 in the substrate core 114. The substrate antenna layers 120 have a top surface 200 that is disposed adjacent a bottom surface 202 of the substrate core 114. The top surface 200 of the substrate antenna layers 120 is disposed in a horizontal plane $P_4$ in the X-Y axes. The shoulder area 132 is between a top surface 204 and the bottom surface 202 of the substrate core 114 such that the substrate sidewall partial shield 102 does not extend down to or adjacent to the top surface 200 of the substrate antenna layers 120 in this example. The top surface 204 of the substrate core 114 is in contact with a bottom surface 206 of the substrate metallization layers 112. The substrate sidewall partial shield 102 is not disposed on and does not extend to or through the horizontal plane $P_4$ of the top surface 200 of the substrate antenna layers 120. Note that as shown in FIG. 1A, the first and second substrate core sidewalls 130(1), 130(2) can extend to other sides of the RFIC package 100 such that the substrate sidewall partial shield 102 is formed on more than one side of the RFIC package 100.

The depth of the shoulder area 132 below the top surface 204 of the substrate core 114 shown as height $H_1$, which is also the height $H_1$ of the first substrate core sidewall 130(1), is based on the desired distance between the substrate sidewall partial shield 102 and the substrate antenna layers 120 to avoid creating a resonance cavity in the substrate antenna layers 120 and/or the substrate 113. For example, a height $H_2$ of the second substrate core sidewall 130(2) is greater than zero (0) if the substrate sidewall partial shield 102 does not extend all the way down the substrate core 114 to the top surface 200 of the substrate antenna layers 120. There is not a second substrate core sidewall 130(2) such that height $H_2$ is effectively zero (0) if the substrate sidewall partial shield 102 does extend all the way down the substrate core 114 to the top surface 200 of the substrate antenna layers 120. If the height $H_2$ of the second substrate core sidewall 130(2) is greater than zero (0), as an example, a ratio of the height $H_1$ of the first substrate core sidewall 130(1) to the height $H_2$ of the second substrate core sidewall 130(2) may be 1.0. Note that alternatively, the substrate core 114 could just have the first substrate core sidewall 130(1) that extends all the way to the top surface 200 of the substrate antenna layers 120 if it is desired to extend the substrate sidewall partial shield 102 all the way to the top surface 200 of the substrate antenna layers 120. In this example, a shoulder area would be created at the top surface 200 of the substrate antenna layers 120. There is a tradeoff between how far the substrate sidewall partial shield 102 extends towards the substrate antenna layers 120 to provide the desired EMI shield 104 of the IC die layer 106 versus the desire to avoid creating a resonance cavity in the substrate antenna layers 120 and/or the substrate 113.

Figure 4A:
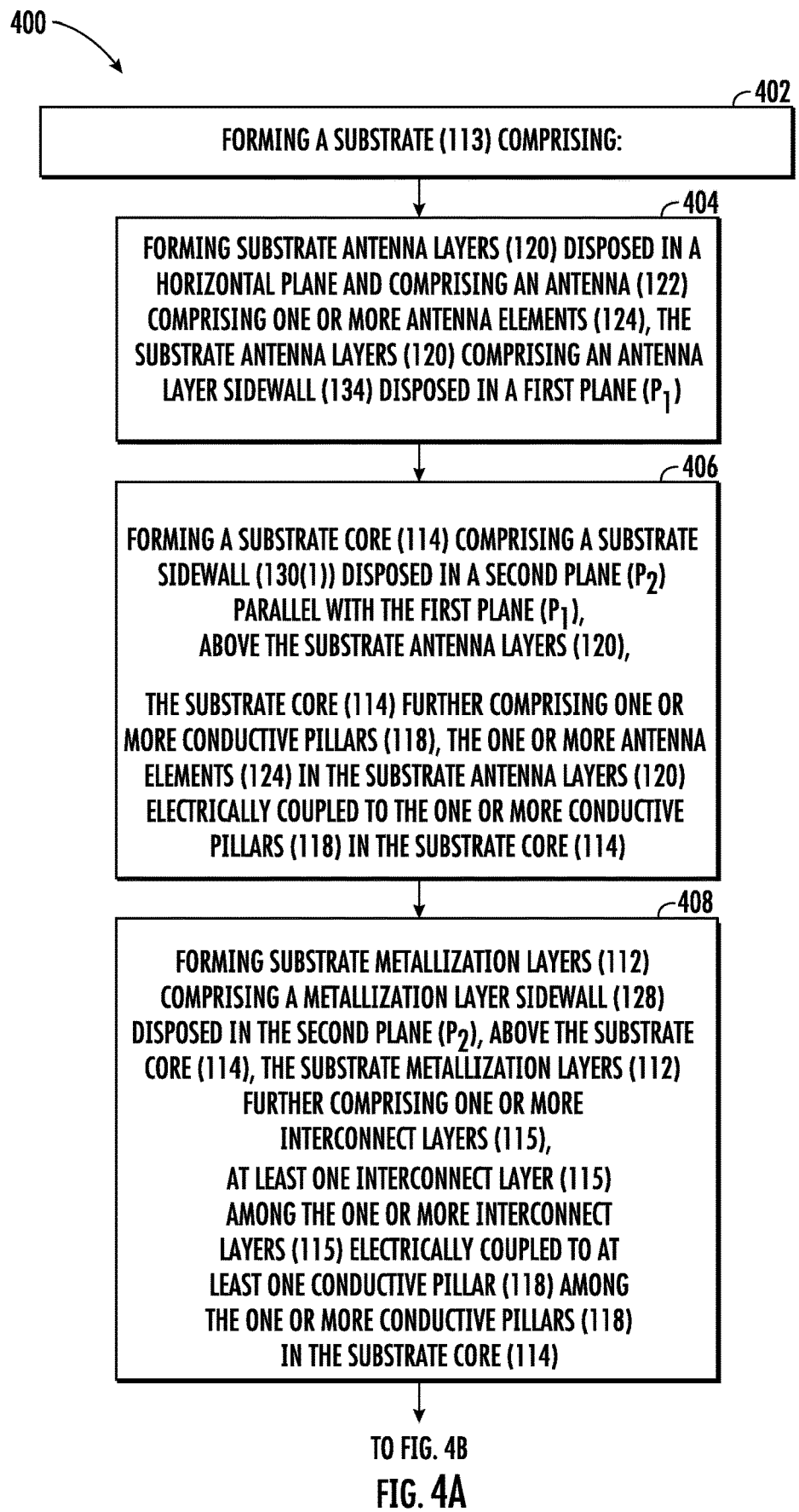
Figure 8A:
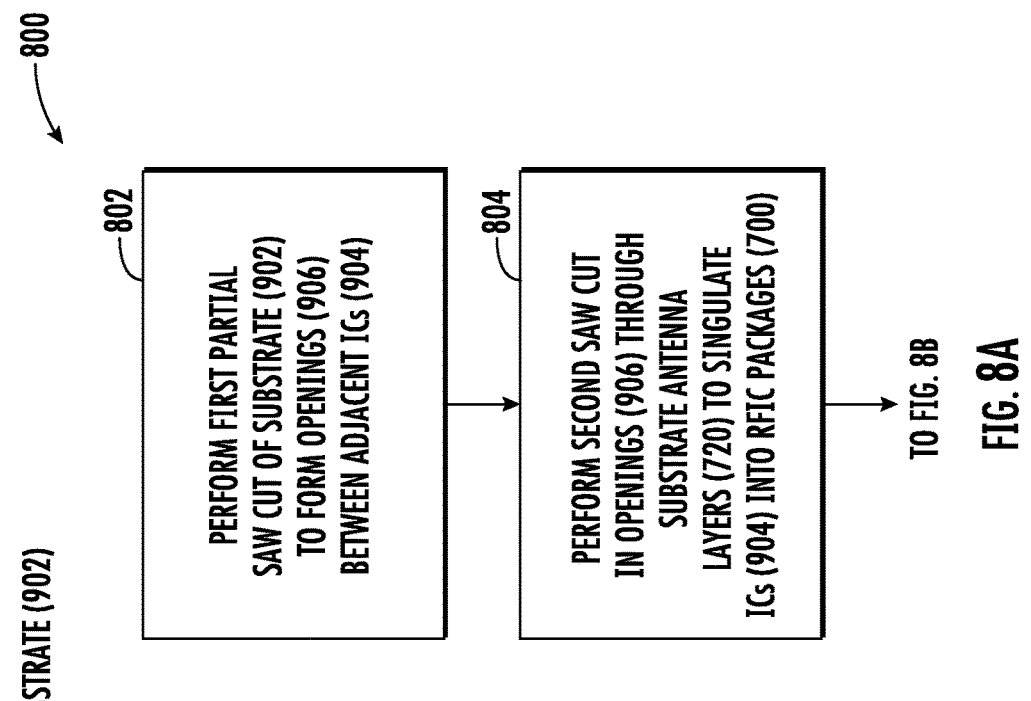

FIGS. 4A and 4B illustrate a flowchart illustrating an exemplary process 400 of fabricating the RFIC package 100 in FIGS. 1A-2B that employs the substrate sidewall partial shield 102 for EMI shielding. The process 400 includes forming the substrate 113 of the RFIC package 100 (block 402 in FIG. 4A). Forming the substrate 113 comprises forming substrate antenna layers 120 as part of the substrate 113 and that are disposed in a horizontal plane and comprising an antenna 122 comprising one or more antenna elements 124 (block 404 in FIG. 4A). The substrate antenna layers 120 comprise an antenna layer sidewall 134 disposed in a plane $P_1$. The process 400 also includes forming a substrate core 114 as part of the substrate 113 (block 406 in FIG. 4A). The substrate core 114 comprises a substrate core sidewall 130(1) disposed in a plane $P_2$ parallel with the plane $P_1$, the substrate core 114 disposed on the substrate antenna layers 120 (block 406 in FIG. 4A). The substrate core 114 includes one or more conductive pillars 118 in this example. The one or more antenna elements 124 in the substrate antenna layers 120 are electrically coupled to the one or more conductive pillars 118 in the substrate core 114. The process 400 also includes forming substrate metallization layers 112 comprising a metallization layer sidewall 128 disposed in the plane $P_2$ (block 408 in FIG. 4A). The substrate metallization layers 112 are disposed adjacent the substrate core 114 and include one or more interconnect layers 115, wherein at least one interconnect layer 115 among the one or more interconnect layers 115 is electrically coupled to at least one conductive pillar 118 among the one or more conductive pillars 118 in the substrate core 114.

The process 400 also includes forming an IC die layer 106 comprising a bottom surface 109 and an IC die layer sidewall 126 disposed in the second plane $P_2$ (block 410 in FIG. 4B). The IC die layer 106 includes the RFIC die 108 comprising the active surface 110 comprising one or more die interconnects 119 and an inactive surface 121 opposite the active surface 110. The bottom surface 109 of the IC die layer 106 is mounted on the substrate metallization layers 112 of the substrate 113, wherein at least one die interconnect 119 among the one or more die interconnects 119 is electrically coupled to an interconnect layer 115 among the at least one interconnect layer 115 in the substrate metallization layers 112. The process 400 also includes forming the EMI shield 104 above the IC die layer 106, wherein a bottom surface 136 of the EMI shield 104 is disposed adjacent to the substrate core sidewall 130(1) (block 412 in FIG. 4B).

There are different exemplary fabrication methods that can be used to fabricate the RFIC package 100 according to the fabrication process 400 in FIGS. 4A and 4B. For example, FIGS. 5A-5C are a flowchart illustrating an exemplary double saw process 500 for fabricating the RFIC package 100 in FIGS. 1A-2B that employs a substrate sidewall partial shield 102 for EMI shielding. FIGS. 6A-6D illustrate exemplary fabrication stages in the fabrication of the RFIC package 100 in FIGS. 1A-2B according to the exemplary double saw process 500 in FIGS. 5A-5C. The exemplary process steps in the double saw process 500 in FIGS. 5A-5C will now be discussed in conjunction with the fabrication stages in FIGS. 6A-6D.

Figure 9A:
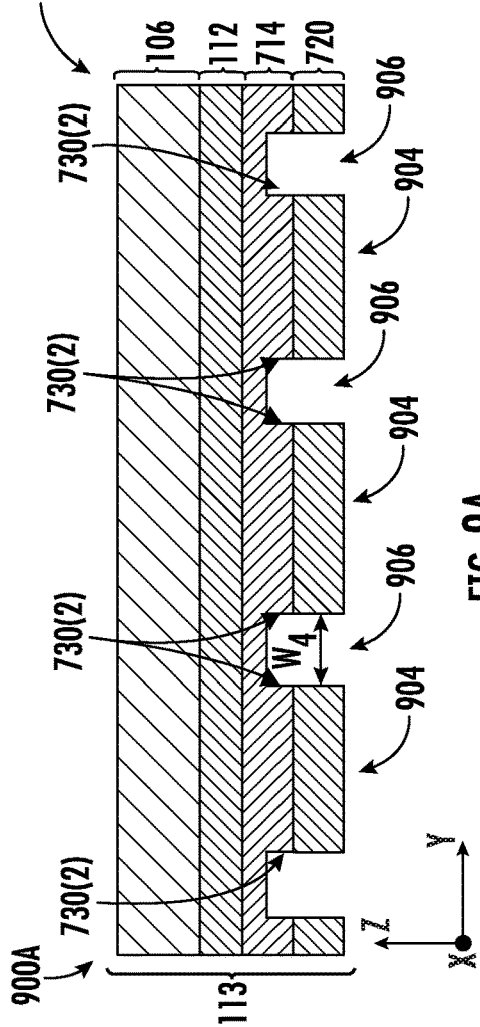
Figure 9B:
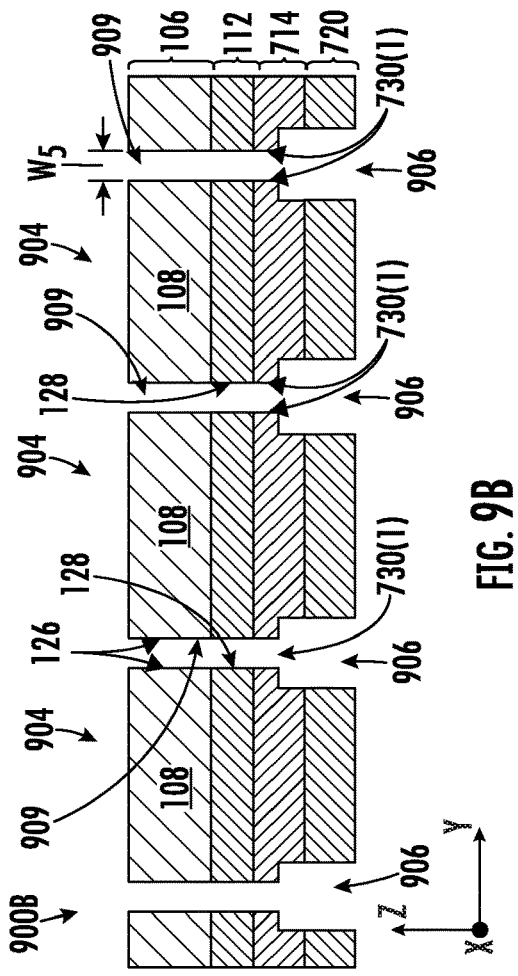
Figure 8E:
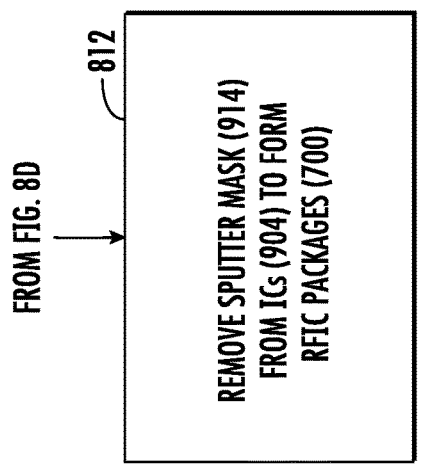
Figures 1, 9F:
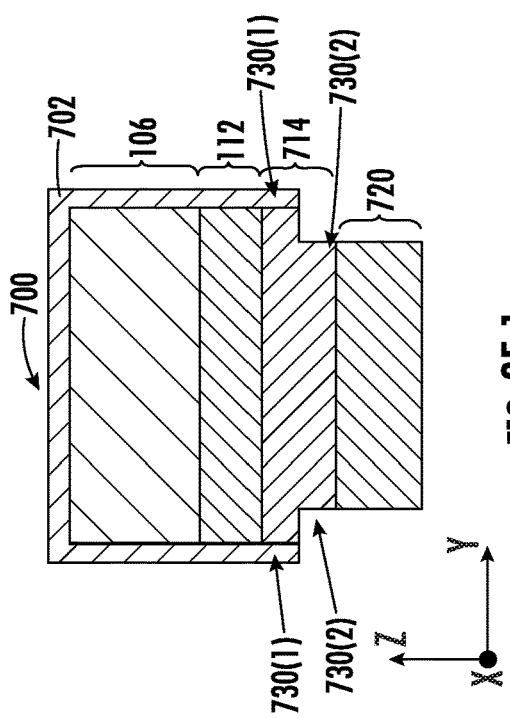
Figures 2, 9F:
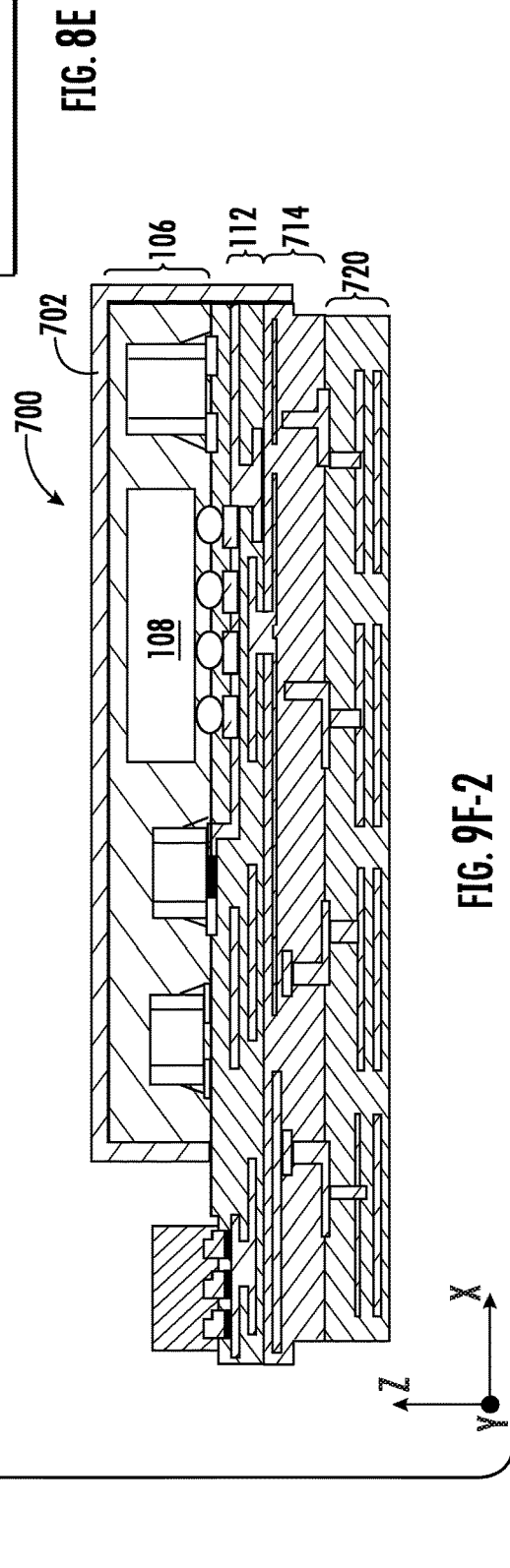

FIGS. 6A-1 and 6A-2 illustrate top and side views, respectively, of a first fabrication stage 600A of the double saw process 500 for fabricating the RFIC package 100 in FIGS. 1A-2B. A first step as shown in the fabrication stage 600A involves performing a first partial saw cut of an substrate 602 that includes a plurality of ICs 604 disposed adjacent to each other on respective substrates 113 of a common substrate 607 to form openings 606 between adjacent ICs 604 (block 502 in FIG. 5A). FIG. 6A-2 illustrates a side view of the along the $A_3$-$A_3$' line of the substrate 602 in FIG. 6A-1. The substrate 602 includes individual substrates 113 that will form respective individual IC packages like RFIC package 100 when the substrate 602 is singulated. As previously discussed in FIGS. 1A-2B, these substrates 113 each include substrate antenna layers 120, a substrate core 114, substrate metallization layers 112, and an IC die layer 106. The arrows 608(1), 608(2) show the directions of the partial saw cuts. The openings 606 of width $W_2$ are formed through the IC die layers 106 and the substrate metallization layers 112 of the ICs 604 in the substrate 602.

The openings 606 extend down into a portion of the substrate cores 114 of the ICs 604 to form respective substrate core sidewalls 130(1) to prepare for an EMI material to be sputtered into the openings 606 and on the IC die layers 106 to form the EMI shields 104. By forming respective substrate core sidewalls 130(1) partially into the substrate cores 114, the EMI material to be sputtered into the openings 606 will not extend down and adjacent to later-formed sidewalls 134 of the substrate antenna layers 120, as previously discussed above.

FIG. 6B illustrates a top view of another fabrication stage 600B of the double saw process 500 for fabricating the RFIC package 100 in FIGS. 1A-2B. In FIG. 5B, a selective sputter mask 610 is provided in the Y-axis direction between adjacent ICs 604 so that a sputtered EMI material, when sputtered, is disposed in the desired areas of the substrate 602 (block 504 in FIG. 5B). Then, as shown in fabrication stage 600C in FIG. 6C of the double saw process 500, the substrate sidewall partial shield 102 is sputtered into the openings 606 and above the IC die layers 106 to form the EMI shield 104 (block 506 in FIG. 5B). By the openings 606 not extending through the substrate antenna layers 120, the sputtered substrate sidewall partial shield 102 is not disposed adjacent the substrate antenna layers 120 in the X-axis and Y-axis directions. The sputter mask 610 is then removed. Then, as shown in the fabrication stage 600D in FIG. 6D, a second saw cut is performed into the openings 606 and through the remainder of the substrate cores 114 and substrate antenna layers 120 to the bottom surface 208 of the substrate antenna layers 120 of width $W_3$ less than width $W_2$ of openings 606 to form the substrate core sidewalls 130(2) and antenna layer sidewalls 134 to singulate the ICs 604 into individual RFIC packages 100 (block 508 in FIG. 5C). Providing the second saw cut of width $W_3$ less than width $W_2$ of openings 606 preserves the sputtered substrate sidewall partial shield 102 on the IC die layer sidewalls 126, the metallization layer sidewalls 128, and the substrate core sidewalls 130(1).

As discussed in the exemplary RFIC package 100 in FIGS. 1A-2B, the EMI shield 104 is formed by only disposing the substrate sidewall partial shield 102 down to the substrate core 114. The substrate sidewall partial shield 102 can be disposed down to a top surface 204 of the substrate core 114, partially into the top surface 204 of the substrate core 114, or down to a bottom surface 202 of the substrate core 114 as examples. In the RFIC package 100, the antenna layer sidewall 134 extends out further from a center plane $P_3$ of the RFIC package 100 to create a step profile in the substrate core 114. However, it is also possible to provide an RFIC package with a substrate sidewall partial shield 102 where the antenna layer sidewall 134 does not extend out as far from the center plane of the RFIC package than the sidewalls of the IC die layer and the substrate metallization layers and/or a least a portion of a sidewall of a substrate core. Such an example of an RFIC package in shown in FIGS. 7A-7C.

In this regard, FIGS. 7A-7C are respective top, front, and side views of an exemplary RFIC package 700 employing a substrate sidewall partial shield 702 as an EMI shield 704. FIG. 7B is a front view of the RFIC package 700 along the $A_4$-$A_4$' line in FIG. 7A. FIG. 7C is a side view of the RFIC package 700 along the $A_5$-$A_5$' line in FIG. 7A. As discussed in more detail below, the RFIC package 700 is similar to the RFIC package 100 in FIGS. 1A-2B, with common elements shown with common element numbers between FIGS. 1A-2B and FIG. 7. Thus, these elements will not be re-described for FIGS. 7A-7C. However, as shown in FIGS. 7B and 7C, substrate antenna layers 720 as part of a substrate 713 are provided similar to the substrate antenna layers 120, but an antenna layer sidewall 734 in a Y-Z plane $P_4$ of the substrate antenna layers 720 extends distance $D_3$ from the center plane $P_6$ that is less than distance $D_4$ of a substrate core sidewall 730(1) of the substrate core 714 as part of the substrate 713 extending from the center plane $P_6$. A substrate core sidewall 730(2) also extends distance $D_3$ from the center plane $P_6$ to the same plane $P_4$ as the antenna layer sidewall 734 to form shoulder area 732. The width $W_3$ of the shoulder area 732 is determined by the distance between the first and second substrate core sidewalls 730(1), 730(2) as shown in FIGS. 7B and 7C. An antenna layer sidewall 734 of the substrate antenna layers 720 as part of the substrate 713 is disposed in the same plane $P_4$ as the second substrate core sidewall 730(2) in this example.

In this manner, the shoulder area 732 formed by the first and second substrate core sidewalls 730(1), 730(2) disposed in the different planes $P_4$, $P_5$ provides the shoulder area 732 such that substrate sidewall partial shield 702 only extends down and adjacent to the IC die layer sidewall 126, the metallization layer sidewall 128, and the first substrate core sidewall 730(1), but does not extend down and adjacent to the second substrate core sidewall 730(2) in this example. A bottom surface 736 of the substrate sidewall partial shield 702 only extends down to the shoulder area 732 of the substrate core 714 adjacent to the first substrate core sidewall 730(1). In this example, the second substrate core sidewall 730(2) and shoulder area 732 prevent the substrate sidewall partial shield 702 from extending down and adjacent to the antenna layer sidewall 734 such that the substrate sidewall partial shield 702 does not extend down and adjacent to the antenna layer sidewall 734.

In this manner, antenna performance of the substrate antenna layers 720 of the RFIC package 700 in FIGS. 7A-7C may not be degraded and actually may be improved. This is because extending the substrate sidewall partial shield 702 down the antenna layer sidewall 734 of the substrate antenna layers 720 can create a resonance cavity in the substrate antenna layers 720 and/or the substrate 713.

FIGS. 8A-8E are a flowchart illustrating an exemplary double saw process 800 for fabricating the RFIC package 700 in FIGS. 7A-7C that employs a substrate sidewall partial shield 702 for EMI shielding. FIGS. 9A-9F-2 illustrate exemplary fabrication stages in the fabrication of the RFIC package 700 in FIGS. 7A-7C according to the exemplary double saw process 800 in FIGS. 8A-8E. The exemplary process steps in the double saw process 800 in FIGS. 8A-8E will now be discussed in conjunction with the fabrication stages in FIGS. 9A-9F-2.

FIG. 9A illustrates a side view of a first fabrication stage 900A of the double saw process 800 for fabricating the RFIC package 700 in FIGS. 7A-7C. A first step as shown in the fabrication stage 900A involves performing a first partial saw cut of a substrate 902 that includes a plurality of ICs 904 disposed adjacent and on respective substrates 713 to each other to form openings 906 between adjacent ICs 904 (block 802 in FIG. 8A). The substrate 902 includes layers that will form individual IC packages like RFIC package 700 when the substrate 902 is singulated. As previously discussed in FIGS. 7A-7C, these layers include the substrate antenna layers 720, the substrate core 714, the substrate metallization layers 112, and the IC die layer 106. The openings 906 of width $W_4$ are formed from the bottom through the substrate antenna layers 720 and the substrate core 714 of the ICs 904 in the substrate 902. The openings 906 extend into a portion of the substrate cores 714 of the ICs 904 to form respective second substrate core sidewalls 730(2) to prepare for an EMI material to be sputtered into the openings 906 and on the IC die layers 106 to form the EMI shields 704. By forming respective substrate core sidewalls 730(2) partially into the substrate cores 714, the EMI material to be sputtered into the openings 906 will not extend down and adjacent to later-formed antenna layer sidewalls 734 of the substrate antenna layers 720, as discussed below.

FIG. 9B illustrates a side view of another fabrication stage 900B of the double saw process 800 for fabricating the RFIC package 700 in FIGS. 7A-7C. In FIG. 9B, a second saw cut is performed into the openings 906 and through the remainder of the substrate cores 714, the substrate metallization layers 112, and the IC die layers 106 of width $W_5$ less than width $W_4$ of openings 906. This forms openings 909 in the substrate 902 to form the first substrate core sidewalls 730(1), metallization layer sidewalls 128, and IC die layer sidewalls 126 to singulate the ICs 904 into individual RFIC packages 700 (block 804 in FIG. 8A) and to prepare the RFIC packages 700 for receiving a sputtered EMI shield material to form the EMI shield 704.

FIGS. 9C-1 and 9C-2 illustrate respective top and side views of another fabrication stage 900C of the double saw process 800 for fabricating the RFIC package 700 in FIGS. 7A-7C. FIGS. 9C-1 and 9C-2 show the singulated ICs 904 placed in respective openings 908 in a retention structure 910, such as a jig, to retain the ICs 904 to prepare an EMI shield material to be sputtered onto the ICs 904 to form the EMI shield 704 (block 806 in FIG. 8B). The openings 908 are sized to allow the width $W_6$ of the substrate antenna layers 720 to be retained in the openings 908. Portions 912 between the openings 908 in the retention structure 910 will later to serve to prevent an EMI shield material from reaching the second substrate core sidewalls 730(2) and the antenna layer sidewalls 734. FIGS. 9D-1 and 9D-2 illustrate respective top and front views of another fabrication stage 900D of the double saw process 800 for fabricating the RFIC package 700 in FIGS. 7A-7C. FIGS. 9D-1 and 9D-2 show a sputter mask 914 being formed over the singulated ICs 904 in the retention structure 910 to prepare to sputter an EMI shield material over the ICs 904 (block 808 in FIG. 8C).

Then, FIGS. 9E-1 and 9E-2 illustrate respective side and front views of another fabrication stage 900E of the double saw process 800 for fabricating the RFIC package 700 in FIGS. 7A-7C. FIGS. 9E-1 and 9E-2 show a sputtered EMI material being formed over the singulated ICs 904 in the retention structure 910 to form the substrate sidewall partial shield 702 over the ICs 904 to form EMI shields 704 (block 810 in FIG. 8D). FIGS. 9F-1 and 9F-2 illustrate respective side and front views of another fabrication stage 900F of the double saw process 800 for fabricating the RFIC package 700 in FIGS. 7A-7C wherein the sputter mask 914 is removed to form the RFIC packages 700 (block 812 in FIG. 8E).

FIGS. 10A-10B are a flowchart illustrating another exemplary double saw process 1000 for fabricating the RFIC package 700 in FIGS. 7A-7C that employs a substrate sidewall partial shield 702 for EMI shielding. FIGS. 11A-11C illustrate exemplary fabrication stages in the fabrication of the RFIC package 700 in FIGS. 7A-7C according to the exemplary double saw process 1000 in FIGS. 10A-10B. The exemplary process steps in the double saw process 1000 in FIGS. 10A-10B will now be discussed in conjunction with the fabrication stages in FIGS. 11A-11C.

FIG. 11A illustrates a side view of a first fabrication stage 1100A of the double saw process 800 for fabricating the RFIC package 700 in FIGS. 7A-7C. A first step as shown in the fabrication stage 1100A involves performing a first partial saw cut of a substrate 902 that includes a plurality of ICs 904 disposed adjacent to each other on respective substrates 713 of a common substrate 907 to form openings 906 between adjacent ICs 904 (block 1002 in FIG. 10A). The substrate 902 includes layers that will form individual IC packages like RFIC package 700 when the substrate 902 is singulated. As previously discussed in FIGS. 7A-7C, these layers include the substrate antenna layers 720, the substrate core 714, the substrate metallization layers 112, and the IC die layer 106. The openings 906 of width $W_4$ are formed from the bottom through the substrate antenna layers 720 and the substrate core 714 of the ICs 904 in the substrate 902. The openings 906 extend into a portion of the substrate cores 714 of the ICs 904 to form respective second substrate core sidewalls 730(2) to prepare for an EMI material to be sputtered into the openings 906 and on the IC die layers 106 to form the EMI shields 704. By forming respective substrate core sidewalls 730(2) partially into the substrate cores 714, the EMI material to be sputtered into the openings 906 will not extend down and adjacent to later-formed antenna layer sidewalls 734 of the substrate antenna layers 720, as discussed below.

FIG. 11B illustrates a side view of another fabrication stage 1100B of the double saw process 1000 for fabricating the RFIC package 700 in FIGS. 7A-7C. In FIG. 11B, a protective film lamination 1102 is disposed on bottom surfaces 708 of the substrate antenna layers 720 and into the openings 906 (block 1104 in FIG. 10A). In FIG. 11C, a second saw cut is performed into the openings 906 and through the remainder of the substrate cores 714, the substrate metallization layers 112, and the IC die layers 106 of width $W_5$ less than width $W_4$ of openings 906 to form openings 909 (block 1006 in FIG. 10B). This forms the first substrate core sidewalls 730(1), metallization layer sidewalls 128, and IC die layer sidewalls 126 to singulate the ICs 904 into individual RFIC packages 700 and to prepare the RFIC packages 700 for receiving a sputtered EMI shield material to form the EMI shield 704. The remaining fabrication stages and processes can then continue starting at block 806 in FIG. 8B and continuing to block 808 in FIG. 8C as previously described FIGS. 12A-12C are a flowchart illustrating another exemplary double saw process 1200 for fabricating the RFIC package 700 in FIGS. 7A-7C that employs a substrate sidewall partial shield 702 for EMI shielding. FIGS. 13A-13D illustrate exemplary fabrication stages in the fabrication of the RFIC package 700 in FIGS. 7A-7C according to the exemplary double saw process 1200 in FIGS. 12A-12C. The exemplary process steps in the double saw process 1200 in FIGS. 12A-12C will now be discussed in conjunction with the fabrication stages in FIGS. 13A-13D.

FIG. 13A illustrates a side view of a first fabrication stage 1300A of the double saw process 1200 for fabricating the RFIC package 700 in FIGS. 7A-7C. A first step as shown in the fabrication stage 1300A involves performing a first partial saw cut of the substrate 902 that includes a plurality of ICs 904 disposed adjacent to each to form openings 1302 of width $W_5$ between adjacent ICs 904 (block 1202 in FIG. 12A). The substrate 902 includes layers that will form individual IC packages like RFIC package 700 when the substrate 902 is singulated. As previously discussed in FIGS. 7A-7C, these layers include the substrate antenna layers 720, the substrate core 714, the substrate metallization layers 112, and the IC die layer 106. The openings 909 of width $W_5$ are formed from the bottom surfaces 708 of the substrate antenna layers 720, through the substrate cores 714, the substrate metallization layers 112, and the IC die layers 106 to top surfaces 1304 of the IC die layers 106 in the substrate 902. FIG. 13B shows a fabrication stage 1300B of a sputter mask 914 being formed over the singulated ICs 904 to prepare to sputter an EMI shield material over the ICs 904 (block 1204 in FIG. 12A).

FIGS. 13C-1 and 13C-2 illustrate another fabrication stage 1300C where the substrate sidewall partial shield 702 is sputtered on the top surface 1304 of the IC die layers 106 and into the openings 909 to be disposed adjacent the IC die layer sidewall 126, the metallization layer sidewall 128, the substrate core sidewall 730(1), and the antenna layer sidewall 734 (block 1206 in FIG. 12B). Then, as shown in the side view of an IC 904 in the fabrication stage 1300D in FIG. 13D, the sputter mask 914 has been removed and substrate core sidewall 730(1) and antenna layer sidewall 734 are etched to form the substrate core sidewall 730(2) and antenna layer sidewall 734 that is recessed. In this manner, the substrate sidewall partial shield 702 is removed from a portion of the substrate core 714 and the substrate antenna layers 720 (block 1208 in FIG. 12C).

Figure 14:
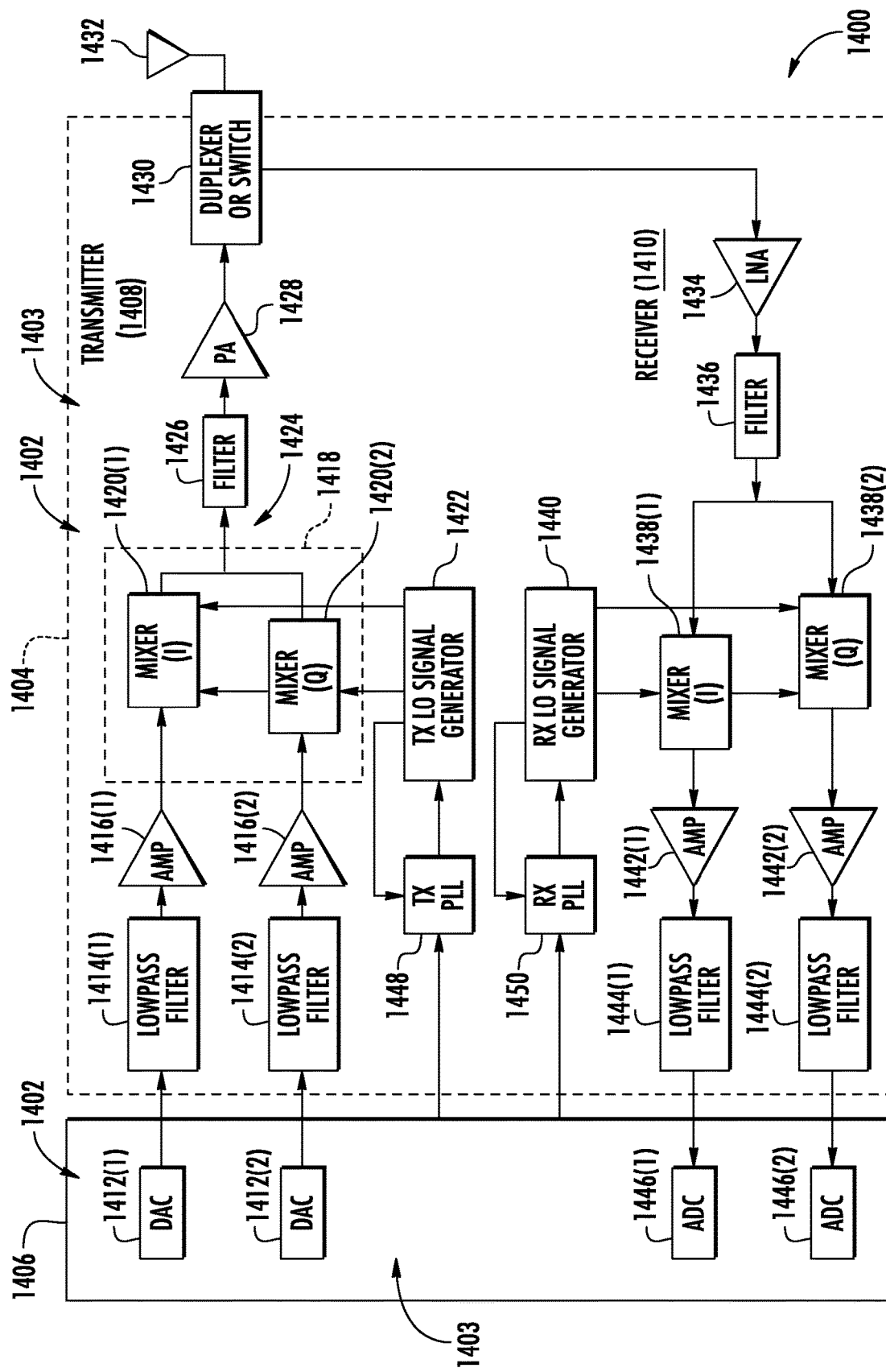
FIG. 14 is a block diagram of an exemplary wireless communications device that includes RF components provided in one or more RFIC packages employing a substrate sidewall partial shield for EMI shielding, including, but not limited to, the RFIC packages in FIGS. 1A-2B and 7A-7C, and according to any of the fabrication processes in FIGS. 4A-6D and 8A-13D.

FIG. 14 illustrates an exemplary wireless communications device 1400 that includes RF components formed from one or more ICs 1402, wherein any of the ICs 1402 can be included in an RFIC package 1403 employing a substrate sidewall partial shield for EMI shielding including, but not limited to, the RFIC packages in FIGS. 1A-2B and 7A-7C, and according to any of the fabrication processes in FIGS. 4A-6D and 8A-13D, and may be provided in or integrated into any processor-based device. The wireless communications device 1400 may include or be provided in any of the above referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RFICs, mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes ADCs 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

IC packages employing a substrate sidewall partial shield for EMI shielding, including, but not limited to, the RFIC packages in FIGS. 1A-2B and 7A-7C, and according to any of the fabrication processes in FIGS. 4A-6D and 8A-13D, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 15:
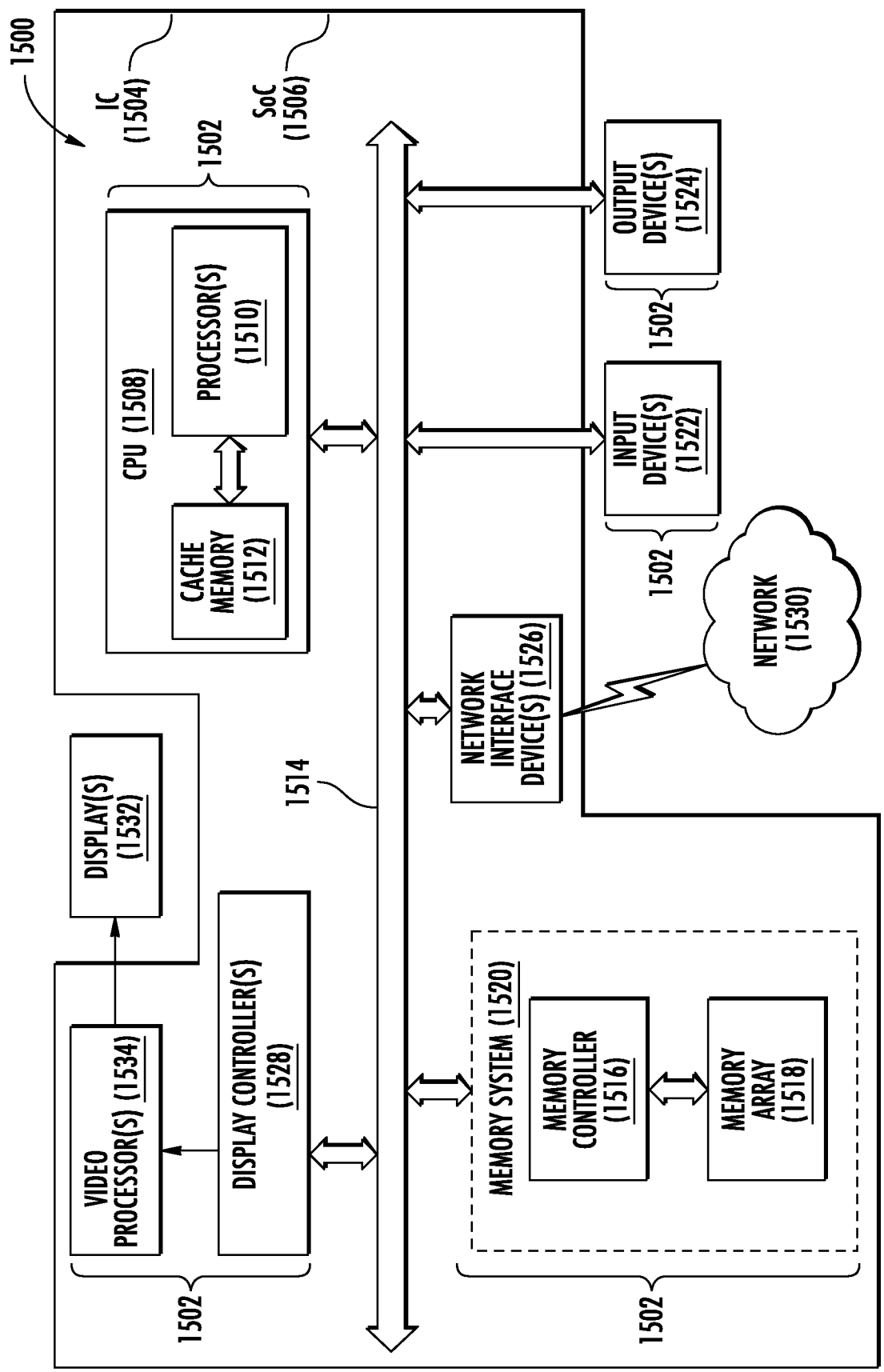
FIG. 15 is a block diagram of an exemplary processor-based system that can be provided in one or more RFIC packages employing a substrate sidewall partial shield for EMI shielding, including, but not limited to, the RFIC packages in FIGS. 1A-2B and 7A-7C, and according to any of the fabrication processes in FIGS. 4A-6D and 8A-13D.

In this regard, FIG. 15 illustrates an example of a processor-based system 1500 that includes circuits that can be provided in an IC package 1502 employing a substrate sidewall partial shield for EMI shielding, including, but not limited to, the IC packages in FIGS. 1A-2B and 7A-7C, and according to any of the fabrication processes in FIGS. 4A-6D and 8A-13D, and according to any aspects disclosed herein. In this example, the processor-based system 1500 may be formed as an IC 1504 in an IC package 1502 and as a system-on-a-chip (SoC) 1506. The processor-based system 1500 includes a CPU 1508 that includes one or more processors 1510, which may also be referred to as CPU cores or processor cores. The CPU 1508 may have cache memory 1512 coupled to the CPU 1508 for rapid access to temporarily stored data. The CPU 1508 is coupled to a system bus 1514 and can intercouple master and slave devices included in the processor-based system 1500. As is well known, the CPU 1508 communicates with these other devices by exchanging address, control, and data information over the system bus 1514. For example, the CPU 1508 can communicate bus transaction requests to a memory controller 1516 as an example of a slave device. Although not illustrated in FIG. 15, multiple system buses 1514 could be provided, wherein each system bus 1514 constitutes a different fabric.

Other master and slave devices can be connected to the system bus 1514. As illustrated in FIG. 15, these devices can include a memory system 1520 that includes the memory controller 1516 and a memory array(s) 1518, one or more input devices 1522, one or more output devices 1524, one or more network interface devices 1526, and one or more display controllers 1528, as examples. Each of the memory system 1520, the one or more input devices 1522, the one or more output devices 1524, the one or more network interface devices 1526, and the one or more display controllers 1528 can be provided in the same or different IC packages 1502. The input device(s) 1522 can include any type of input device, including, but not limited to, input keys, switches, voice processors, etc. The output device(s) 1524 can include any type of output device, including, but not limited to, audio, video, other visual indicators, etc. The network interface device(s) 1526 can be any device configured to allow exchange of data to and from a network 1530. The network 1530 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1526 can be configured to support any type of communications protocol desired.

The CPU 1508 may also be configured to access the display controller(s) 1528 over the system bus 1514 to control information sent to one or more displays 1532. The display controller(s) 1528 sends information to the display(s) 1532 to be displayed via one or more video processors 1534, which process the information to be displayed into a format suitable for the display(s) 1532. The display controller(s) 1528 and video processor(s) 1534 can be included as ICs in the same or different IC packages 1502, and in the same or different IC package 1502 containing the CPU 1508 as an example. The display(s) 1532 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC) package, comprising:
   a first layer comprising an IC die, the first layer comprising a first layer sidewall;
   a substrate antenna layer comprising an antenna layer sidewall that extends a first distance in a horizontal direction;
   a substrate disposed between the substrate antenna layer and the first layer, the substrate comprising a substrate sidewall that at least partially extends a second distance less than the first distance in the horizontal direction towards the antenna layer sidewall to create a shoulder area; and
   an electro-magnetic interference (EMI) shield disposed on the first layer and adjacent to the first layer sidewall and the substrate sidewall,
   a bottom surface of the EMI shield disposed on the shoulder area.

2. The IC package of claim 1, wherein the EMI shield is not disposed adjacent to the antenna layer sidewall.

3. The IC package of claim 1, wherein:
   the substrate antenna layer comprises a top surface adjacent to the substrate; and
   the substrate sidewall fully extends the second distance in the horizontal direction adjacent to the substrate antenna layer to create the shoulder area adjacent to the top surface of the substrate antenna layer.

4. The IC package of claim 1, wherein the substrate sidewall comprises:
   a first substrate sidewall adjacent to the first layer, the first substrate sidewall extending the second distance in the horizontal direction towards the antenna layer sidewall; and
   a second substrate sidewall adjacent to substrate antenna layer, the second substrate sidewall extending the first distance in the horizontal direction towards the antenna layer sidewall to create the shoulder area adjacent to the first substrate sidewall and the second substrate sidewall.

5. The IC package of claim 4, wherein a ratio of a height of the first substrate sidewall to a height of the second substrate sidewall is 1.0.

6. The IC package of claim 1, wherein:
   the antenna layer sidewall is disposed in a first vertical plane orthogonal to the horizontal direction; and
   the substrate sidewall is disposed in a second vertical plane parallel to the first vertical plane.

7. The IC package of claim 1, wherein:
the substrate comprises a substrate metallization layer disposed between the first layer and the substrate antenna layer; and
the substrate metallization layer comprises a metallization layer sidewall that at least partially extends the second distance in the horizontal direction to create the shoulder area.

8. The IC package of claim 7, wherein:
the substrate antenna layer comprises a top surface adjacent to the substrate; and
the metallization layer sidewall fully extends the second distance in the horizontal direction towards the antenna layer sidewall and adjacent to the top surface of the substrate antenna layer to create the shoulder area adjacent to the top surface of the substrate antenna layer.

9. The IC package of claim 7, wherein the metallization layer sidewall comprises:
a first metallization layer sidewall adjacent to the first layer, the first metallization layer sidewall extending the second distance in the horizontal direction towards the antenna layer sidewall; and
a second metallization layer sidewall adjacent to the substrate antenna layer, the second metallization layer sidewall extending the first distance in the horizontal direction towards the antenna layer sidewall to create the shoulder area adjacent to the first metallization layer sidewall and the second metallization layer sidewall.

10. The IC package of claim 9, wherein a ratio of a height of the first metallization layer sidewall to a height of the second metallization layer sidewall is 1.0.

11. The IC package of claim 7, wherein:
the antenna layer sidewall is disposed in a first vertical plane orthogonal to the horizontal direction; and
the metallization layer sidewall is disposed in a second vertical plane parallel to the first vertical plane.

12. The IC package of claim 1, wherein:
the substrate comprises:
a substrate metallization layer disposed between the first layer and the substrate antenna layer; and
a substrate core disposed between the substrate metallization layer and the substrate antenna layer; and
wherein:
the substrate metallization layer comprises a metallization layer sidewall that extends the second distance in the horizontal direction towards the antenna layer sidewall; and
the substrate core comprises a substrate core sidewall that at least partially extends the second distance in the horizontal direction towards the antenna layer sidewall to create the shoulder area.

13. The IC package of claim 12, wherein:
the substrate metallization layer comprises a top surface adjacent to the substrate antenna layer; and
the substrate core sidewall fully extends the second distance in the horizontal direction towards the antenna layer sidewall and adjacent to the substrate antenna layer to create the shoulder area adjacent to the top surface of the substrate metallization layer.

14. The IC package of claim 12, wherein the substrate core sidewall comprises:
a first substrate core sidewall adjacent to the substrate metallization layer, the first substrate core sidewall extending the second distance in the horizontal direction towards the antenna layer sidewall; and
a second substrate core sidewall adjacent to the substrate antenna layer, the second substrate core sidewall extending the first distance in the horizontal direction towards the antenna layer sidewall to create the shoulder area adjacent to the first substrate core sidewall and the second substrate core sidewall.

15. The IC package of claim 14, wherein a ratio of a height of the first substrate core sidewall to a height of the second substrate core sidewall is 1.0.

16. The IC package of claim 12, wherein:
the antenna layer sidewall is disposed in a first vertical plane orthogonal to the horizontal direction;
the metallization layer sidewall is disposed in a second vertical plane parallel to the first vertical plane; and
the substrate core sidewall disposed at least partially in the second vertical plane.

17. The IC package of claim 1, wherein the first layer further comprises a power management IC (PMIC) die comprising an active surface comprising one or more die interconnects and an inactive surface opposite the active surface.

18. The IC package of claim 1, wherein the substrate antenna layer comprises a 5G antenna.

19. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *